United States Patent
Cho et al.

(10) Patent No.: US 12,426,359 B2
(45) Date of Patent: Sep. 23, 2025

(54) SEMICONDUCTOR DEVICE INCLUDING SOURCE/DRAIN REGIONS HAVING TRIANGULAR TIP REGIONS

(71) Applicant: SAMSUNG ELECTRONICS CO., LTD., Suwon-si (KR)

(72) Inventors: Namkyu Cho, Yongin-si (KR); Seokhoon Kim, Suwon-si (KR); Sanggil Lee, Ansan-si (KR); Pankwi Park, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 510 days.

(21) Appl. No.: 17/966,472

(22) Filed: Oct. 14, 2022

(65) Prior Publication Data

US 2023/0215867 A1 Jul. 6, 2023

(30) Foreign Application Priority Data

Jan. 4, 2022 (KR) ........................ 10-2022-0000824

(51) Int. Cl.
*H10D 84/85* (2025.01)
*H01L 21/02* (2006.01)
(Continued)

(52) U.S. Cl.
CPC ....... *H10D 84/85* (2025.01); *H01L 21/02603* (2013.01); *H10D 30/014* (2025.01);
(Continued)

(58) Field of Classification Search
CPC . H10D 30/6735; H10D 62/121; H10D 84/017
See application file for complete search history.

(56) References Cited

U.S. PATENT DOCUMENTS

| 10,784,258 B2 | 9/2020 | Mehta et al. |
| 10,861,749 B2 | 12/2020 | Chen et al. |

(Continued)

*Primary Examiner* — Brian Turner
(74) *Attorney, Agent, or Firm* — Sughrue Mion, PLLC

(57) ABSTRACT

A semiconductor device includes a substrate including a first region, a second region, and active regions extending in a first direction in the first region and in the second region; gate electrodes on the first region and the second region, the gate electrodes intersecting the active regions and extending in a second direction; a plurality of channel layers spaced apart from each other in a third direction on active regions of the active regions and encompassed by the gate electrodes, the third direction being perpendicular to an upper surface of the substrate; and first source/drain regions and second source/drain regions in portions of the active regions that are recessed on both sides of the gate electrodes, the first source/drain regions and the second source/drain regions being connected to the plurality of channel layers, wherein the first source/drain regions are in the first region, and the second source/drain regions are in the second region, wherein an end portion of each of the first source/drain regions in the second direction in a plan view includes a tip region protruding in the second direction, and wherein an end portion of each of the second source/drain regions in the second direction in the plan view extends flatly in the first direction.

19 Claims, 27 Drawing Sheets

(51) Int. Cl.
*H10D 30/01* (2025.01)
*H10D 30/43* (2025.01)
*H10D 30/67* (2025.01)
*H10D 62/10* (2025.01)
*H10D 62/13* (2025.01)
*H10D 62/832* (2025.01)
*H10D 64/01* (2025.01)
*H10D 84/01* (2025.01)
*H10D 84/03* (2025.01)

(52) U.S. Cl.
CPC ........... *H10D 30/031* (2025.01); *H10D 30/43* (2025.01); *H10D 30/6735* (2025.01); *H10D 62/121* (2025.01); *H10D 62/151* (2025.01); *H10D 62/832* (2025.01); *H10D 64/017* (2025.01); *H10D 84/0167* (2025.01); *H10D 84/017* (2025.01); *H10D 84/038* (2025.01)

(56) References Cited

U.S. PATENT DOCUMENTS

| | | |
|---|---|---|
| 11,011,511 B2 | 5/2021 | Kang et al. |
| 11,038,018 B2 | 6/2021 | Jeong et al. |
| 11,145,536 B2 | 10/2021 | Ku et al. |
| 2006/0024874 A1 | 2/2006 | Yun et al. |
| 2019/0393357 A1* | 12/2019 | Chen ................ H10D 30/014 |
| 2020/0235227 A1* | 7/2020 | Chang ................ H10D 64/681 |
| 2020/0388681 A1* | 12/2020 | Yamashita ........... H10D 62/116 |
| 2021/0057545 A1* | 2/2021 | Lin ................ H10D 30/6211 |
| 2021/0118880 A1 | 4/2021 | Kim et al. |
| 2021/0134794 A1* | 5/2021 | Huang ................ H10D 30/031 |
| 2021/0210598 A1* | 7/2021 | Cheng ................ H10D 62/115 |
| 2022/0029001 A1* | 1/2022 | Chang ................ H10D 30/024 |
| 2022/0278198 A1* | 9/2022 | Lee ................ H10D 30/6735 |

\* cited by examiner

SEMICONDUCTOR DEVICE INCLUDING SOURCE/DRAIN REGIONS HAVING TRIANGULAR TIP REGIONS

CROSS-REFERENCE TO RELATED APPLICATION(S)

This application claims priority to Korean Patent Application No. 10-2022-0000824 filed on Jan. 4, 2022 in the Korean Intellectual Property Office, the disclosure of which is incorporated by reference herein in its entirety.

BACKGROUND

The present disclosure relates to a semiconductor device.

As demand for high levels of performance, high speed, and/or multifunctionality in semiconductor devices has increased, the degree of integration of semiconductor devices has increased. In manufacturing semiconductor devices having a micropattern corresponding to the trend for high integration of semiconductor devices, it is necessary to implement patterns having a fine width or a fine separation distance. In addition, in order to overcome limitations in operating characteristics due to a size reduction of planar metal-oxide-semiconductor field-effect transistors (MOSFETs), efforts have been made to develop a semiconductor device having a channel having a three-dimensional (3D) structure.

SUMMARY

One or more example embodiments of the present disclosure provide a semiconductor device having improved mass productivity.

According to an aspect of an example embodiment, a semiconductor device includes: a substrate including a first region, a second region, and active regions extending in a first direction in the first region and in the second region; gate electrodes on the first region and the second region, the gate electrodes intersecting the active regions and extending in a second direction; a plurality of channel layers spaced apart from each other in a third direction on active regions of the active regions and encompassed by the gate electrodes, the third direction being perpendicular to an upper surface of the substrate; and first source/drain regions and second source/drain regions in portions of the active regions that are recessed on both sides of the gate electrodes, the first source/drain regions and the second source/drain regions being connected to the plurality of channel layers, wherein the first source/drain regions are in the first region, and the second source/drain regions are in the second region, wherein an end portion of each of the first source/drain regions in the second direction in a plan view includes a tip region protruding in the second direction, and wherein an end portion of each of the second source/drain regions in the second direction in the plan view extends flatly in the first direction.

According to an aspect of an example embodiment, a semiconductor device includes: a first active region and a second active region extending in a first direction, spaced apart from each other in a second direction, the first active region including impurities of a first conductivity type and the second active region including impurities of a second conductivity type different from the first conductivity type; at least one gate electrode intersecting the first active region and the second active region and extending in the second direction; a plurality of channel layers spaced apart from each other in a third direction on the first active region and the second active region and encompassed by the at least one gate electrode, the third direction being perpendicular to an upper surface of the substrate; first source/drain regions on both sides of the at least one gate electrode on the first active region, the first source/drain regions being connected to the plurality of channel layers; and second source/drain regions disposed on both sides of the at least one gate electrode on the second active region, the second source/drain regions being connected to the plurality of channel layers, wherein the first source/drain regions and the second source/drain regions have different shapes in a plan view, and wherein an end portion of each of the first source/drain regions in the second direction in the plan view includes a tip region protruding in the second direction.

According to an aspect of an example embodiment, a semiconductor device includes: a substrate including a first region, a second region, and active regions extending in a first direction in the first region and in the second region; gate structures on the first region and the second region, the gate structures intersecting the active regions and extending in a second direction; and first source/drain regions and second source/drain regions in respective portions of the active regions that are recessed on both sides of the gate structures, wherein the first source/drain regions are in the first region and an end portion of each of the first source/drain regions in the second direction includes a tip region protruding in the second direction in a plan view, wherein the second source/drain regions are in the second region and an end portion of each of the second source/drain regions in the second direction is formed without a region protruding in the second direction in the plan view, and wherein a first length of a portion of each of the first source/drain regions in contact with at least one of the gate structures and extending in the second direction is greater than a second length by which each tip region protrudes in the second direction.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Hereinafter, example embodiments of the present disclosure will be described with reference to the accompanying drawings.

Figure 1:
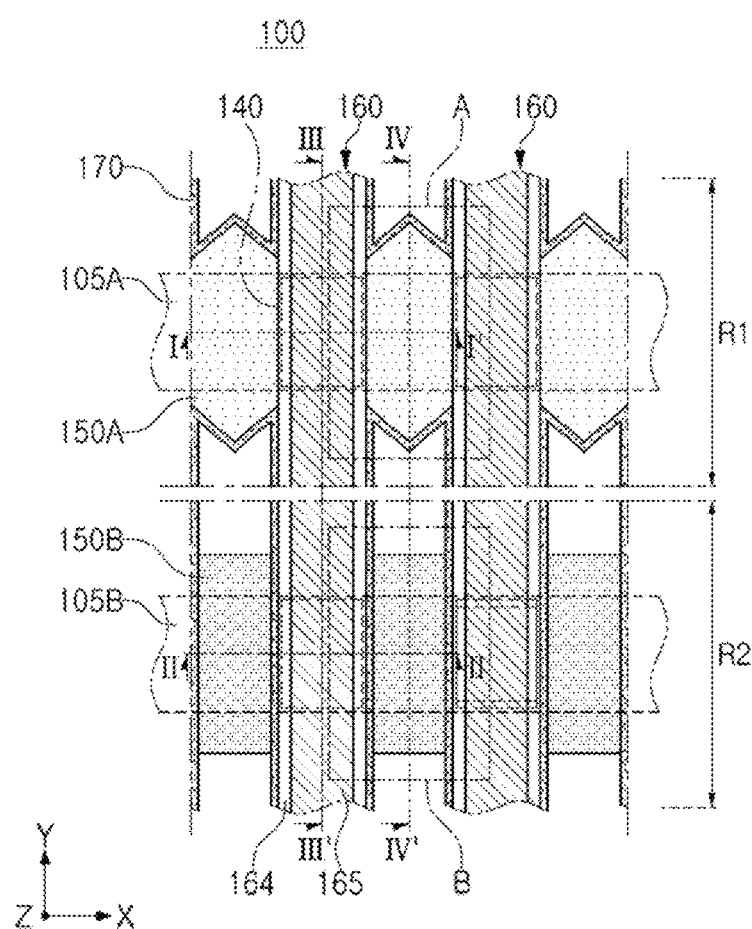
FIG. 1 is a plan view illustrating a semiconductor device according to example embodiments.

FIG. 1 is a plan view illustrating a semiconductor device according to example embodiments. For convenience of description, only some components of the semiconductor device are illustrated in FIG. 1.

Figure 2A:
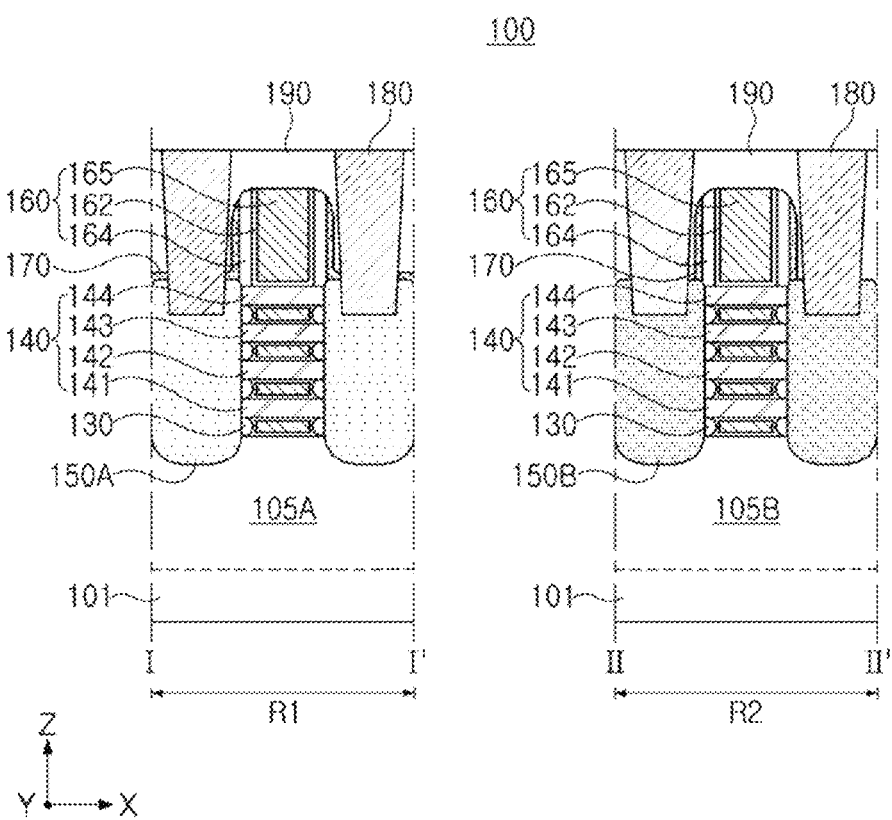
FIGS. 2A to 2C are cross-sectional views illustrating semiconductor devices according to example embodiments.
Figure 2B:
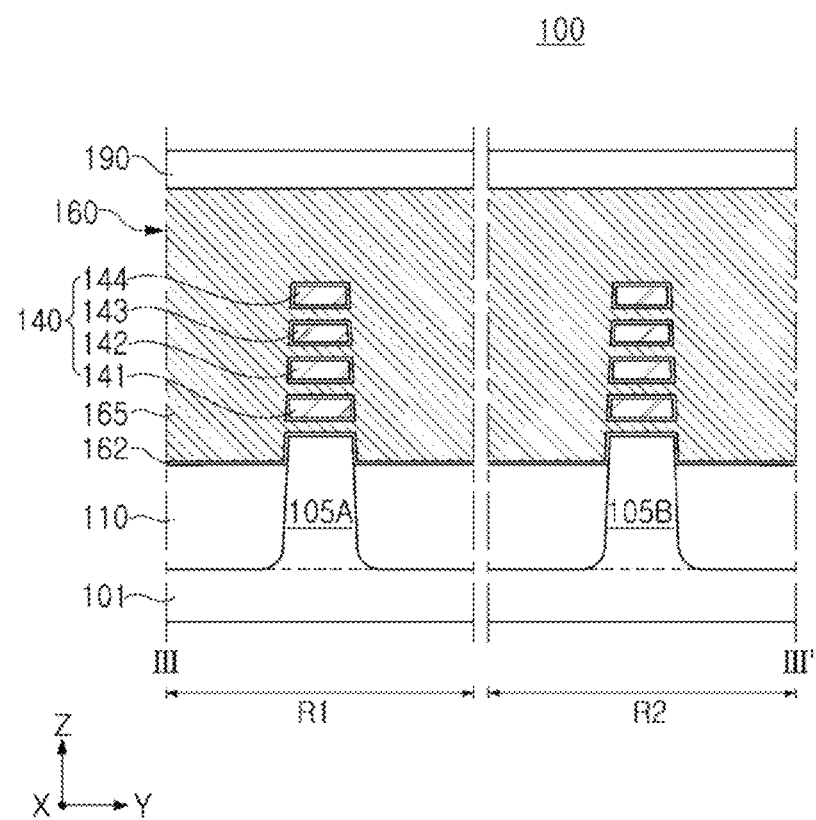
Figure 2C:
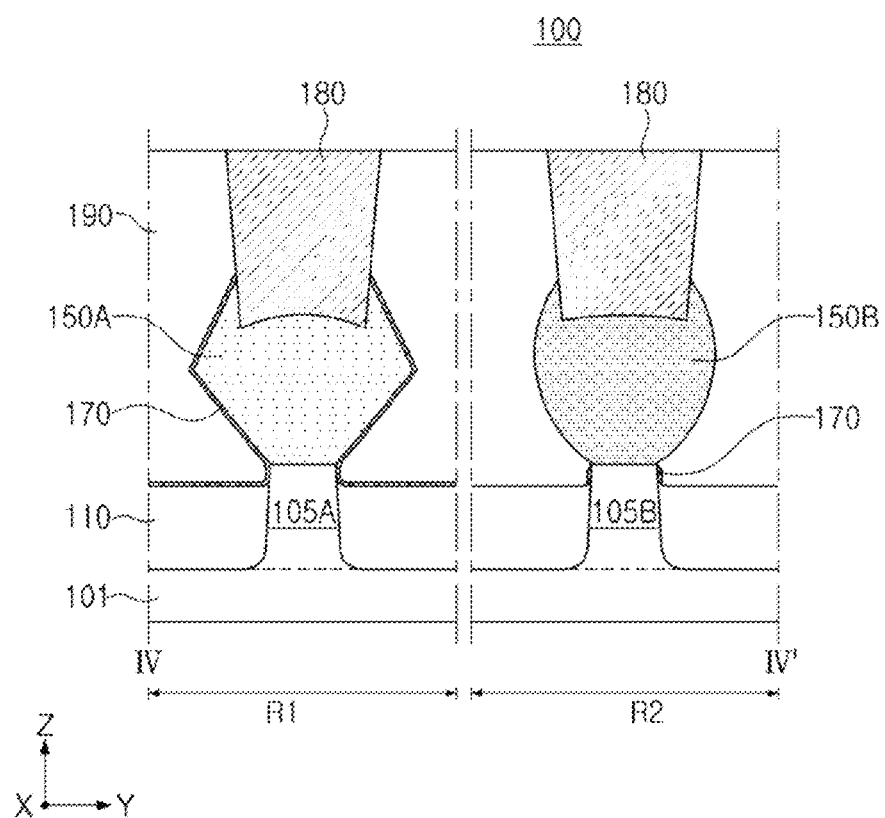

FIGS. 2A to 2C are cross-sectional views illustrating a semiconductor device according to example embodiments. FIG. 2A is a cross-sectional view of the semiconductor device of FIG. 1 taken along lines I-I' and II-II', FIG. 2B is a cross-sectional view taken along line III-III', and FIG. 2C is a cross-sectional view taken along line IV-IV'.

Figure 3:
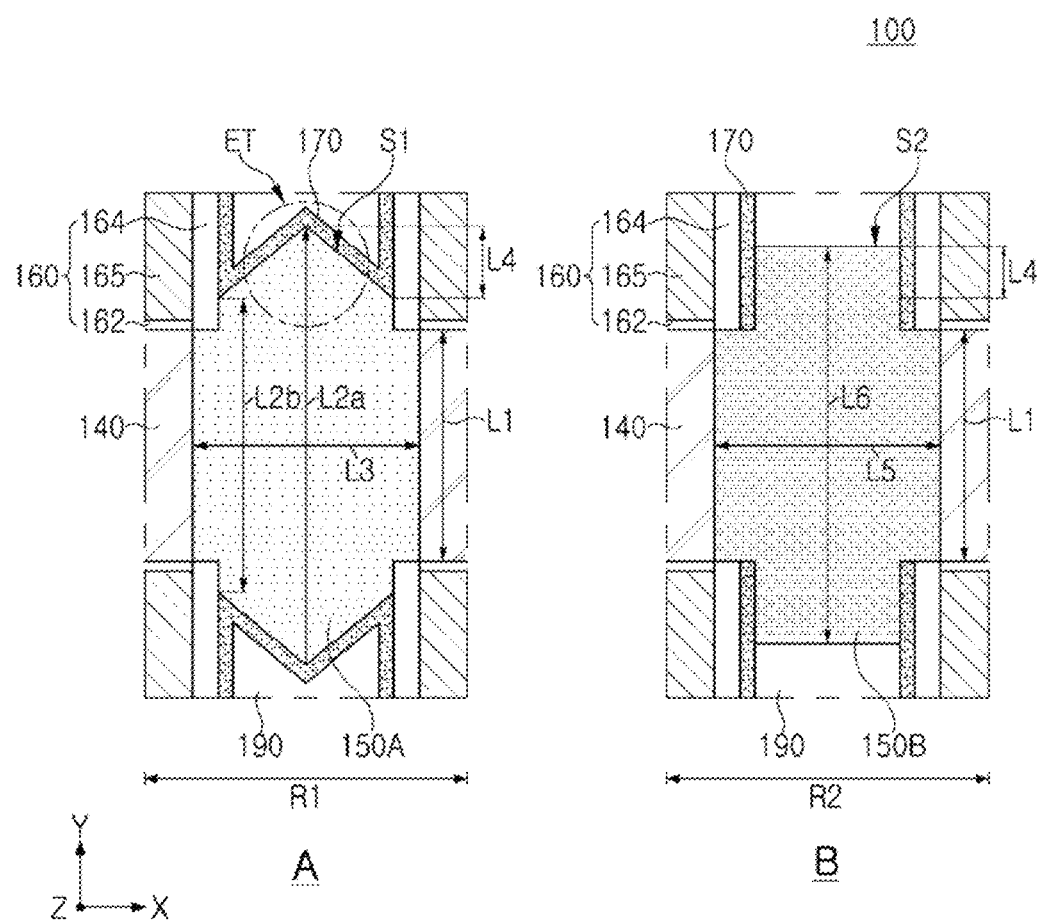
FIG. 3 is a plan view illustrating a semiconductor device according to example embodiments.

FIG. 3 is plan view illustrating a semiconductor device according to example embodiments. In FIG. 3, region 'A' and region 'B' of FIG. 1 are enlarged and illustrated in a plane at a level of the uppermost surface of a channel structure 140.

First, referring to FIGS. 1 to 2C, the semiconductor device 100 may include a substrate 101 having first and second regions R1 and R2 and including first and second active regions 105A and 105B, channel structures 140 including first to fourth channel layers 141, 142, 143, and 144 vertically spaced apart from each other on the first and second active regions 105A and 105B, gate structures 160 extending to cross the first and second active regions 105A and 105B, first and second source/drain regions 150A and 150B disposed to be in contact with the first to fourth channel layers 141, 142, 143 and 144, and contact plugs 180 connected to the first and second source/drain regions 150A and 150B. The gate structure 160 may include gate dielectric layers 162, gate spacer layers 164, and a gate electrode 165, and the semiconductor device 100 may further include a device isolation layer 110, inner spacer layers 130, a capping layer 170, and an interlayer insulating layer 190.

In the semiconductor device 100, the first and second active regions 105A and 105B have a fin structure, and the gate electrode 165 may be disposed between the first and second active regions 105A and 105B and the channel structures 140, between the first to fourth channel layers 141, 142, 143, and 144 of the channel structures 140, and on the channel structures 140. Accordingly, the semiconductor device 100 may include transistors of a multi-bridge channel field effect transistor (MBCFET™) structure that is a gate-all-around type FET disposed in the first and second regions R1 and R2.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The first and second regions R1 and R2 of the substrate 101 may be adjacent to each other or spaced apart from each other. The first region R1 may be a region in which a p-type transistor PMOS is disposed, and the second region R2 may be a region in which an n-type transistor NMOS is disposed.

The substrate 101 may include first and second active regions 105A and 105B disposed thereon. The first and second active regions 105A and 105B are defined by the device isolation layer 110 in the substrate 101 and may be disposed to extend in a first direction, for example, an X-direction. However, the first and second active regions 105A and 105B may be described as components separate from the substrate 101. The first and second active regions 105A and 105B may have a structure protruding upwardly. The first and second active regions 105A and 105B may be formed as a portion of the substrate 101, or may include an epitaxial layer grown from the substrate 101. However, the first and second active regions 105A and 105B may be partially recessed on both sides of the gate structures 160 to form recess regions, and the first and second source/drain regions 150A and 150B may be disposed in the recess regions (see, e.g., FIG. 2A).

In example embodiments, the first and second active regions 105A and 105B may include a well region including impurities. For example, in the first active region 105A of the first region R1 in which the p-type transistor PMOS is disposed, the well region may include n-type impurities (e.g., a first conductivity type) such as phosphorus (P), arsenic (As), or antimony (Sb). In the second active region 105B of the second region R2 in which the n-type transistor NMOS is disposed, the well region may include p-type impurities (e.g., a second conductivity type) such as boron (B), gallium (Ga), or aluminum (Al). The well regions may be positioned at a predetermined depth from upper surfaces of the first and second active regions 105A and 105B.

The device isolation layer 110 may define the first and second active regions 105A and 105B in the substrate 101. The device isolation layer 110 may be formed by, for example, a shallow trench isolation (STI) process. In some embodiments, the device isolation layer 110 may further include a region having a step below the substrate 101 and extending more deeply. The device isolation layer 110 may expose upper surfaces of the first and second active regions 105A and 105B, and in some embodiments, partially expose upper portions of the first and second active regions 105A and 105B. In example embodiments, the device isolation layer 110 may have a curved upper surface to have a higher level toward the first and second active regions 105A and 105B (see, e.g., FIG. 2C). The device isolation layer 110 may be formed of an insulating material. The device isolation layer 110 may be, for example, oxide, nitride, or a combination thereof.

The channel structures 140 may be disposed on the first and second active regions 105A and 105B in regions in which the first and second active regions 105A and 105B intersect the gate structures 160. The channel structures 140 may not extend to the device isolation layer 110 and may be positioned only on (e.g., above) the first and second active regions 105A and 105B. The entire channel structures 140 may be disposed to overlap the first and second active regions 105A and 105B and the gate structures 160 in a z-direction (see, e.g., FIG. 1). Each of the channel structures 140 may include first to fourth channel layers 141, 142, 143, and 144, which are two or more channel layers spaced apart from each other in the z-direction. The channel structures 140 may be connected to the first and second source/drain regions 150A and 150B.

The channel structures 140 may have a width equal to or smaller than that of the first and second active regions 105A and 105B in the Y-direction, and may have a width equal to or similar to that of the gate structures 160 in the X-direction. In some embodiments, the channel structures 140 may have a reduced width so that side surfaces thereof are positioned below the gate structures 160 in the X-direction. Both side surfaces of the channel structures 140 in the Y-direction may have a slope (see, e.g., FIG. 2B). The slope may be a slope extending from both side surfaces of the first and second active regions 105A and 105B in the Y-direction. Accordingly, both side surfaces of the channel structures 140 in the Y-direction may be positioned on a straight line with both side surfaces of the first and second active regions 105A and 105B in the Y-direction.

The channel structures 140 may be formed of a semiconductor material, and may include, for example, at least one of silicon (Si), silicon germanium (SiGe), and germanium (Ge). The channel structures 140 may be formed of, for example, the same material as that of the substrate 101. In some embodiments, the channel structures 140 may include an impurity region positioned in a region adjacent to the first and second source/drain regions 150A and 150B. The number and shape of the channel layers constituting one channel structure 140 may be variously changed in the embodiments. For example, in some embodiments, the channel structures 140 may further include a channel layer disposed below a lowermost region of the gate electrode 165.

The first and second source/drain regions 150A and 150B may be disposed on the first and second active regions 105A and 105B at both sides of the gate structures 160 and the channel structures 140. In other words, the first source/drain region 150A may be disposed at both sides of one of the gate structures 160 and the second source/drain region 150B may be disposed at both sides of another one of the gate structures 160. The first and second source/drain regions 150A and 150B may be disposed in recess regions in which upper portions of the first and second active regions 105A and 105B are partially recessed. The first and second source/drain regions 150A and 150B may be in contact with the first to fourth channel layers 141, 142, 143 and 144 of the channel structures 140 and may be disposed to cover side surfaces of the first to fourth channel layers 141, 142, 143, and 144. Upper surfaces of the first and second source/drain regions 150A and 150B may be located at the same or similar height to lower surfaces of the uppermost regions of the gate electrode 165, and the height may be variously changed in embodiments.

The first and second source/drain regions 150A and 150B may be formed of a semiconductor material. For example, the first and second source/drain regions 150A and 150B may include at least one of silicon germanium (SiGe), silicon (Si), silicon arsenic (SiAs), silicon phosphide (SiP), and silicon carbide (SiC). The first and second source/drain regions 150A and 150B may be formed of an epitaxial layer. The first and second source/drain regions 150A and 150B may include different materials. For example, the first source/drain regions 150A may include a silicon germanium (SiGe) layer doped with the p-type impurities (e.g., a first material), and the second source/drain regions 150B may include a silicon (Si) layer doped with the n-type impurities (e.g., a second material). In example embodiments, the first and second source/drain regions 150A and 150B may include a plurality of regions including elements and/or doped elements having different concentrations.

The first source/drain regions 150A and the second source/drain regions 150B may have different shapes in a cross-sectional view and plan view. As illustrated in FIG. 2C, in a cross-section in the Y-direction, the first source/drain regions 150A may have a polygonal or rounded polygonal shape, and the second source/drain regions 150B may have a more rounded shape, for example, an elliptical shape, compared with the first source/drain regions 150A.

Referring to FIGS. 1 and 3, the first source/drain regions 150A may have tip regions ET in which end portions 51 or side surfaces in the Y-direction in plan view protrude outwardly (e.g., in the Y-direction) at the center of the side surface in the X-direction. In contrast, the second source/drain regions 150B may not have a shape in which one region protrudes in the Y-direction, and may have a shape in which end portions S2 or side surfaces in the Y-direction in plan view are substantially flat in the X-direction.

The tip regions ET of the first source/drain regions 150A may include a triangular region. The shape in plan view may be a shape as the first source/drain regions 150A mainly grow along a crystal plane. This will be described in detail with reference to FIGS. 11A and 11B below. The tip regions ET may be located at the center of the first source/drain regions 150A in the X-direction, and may be located outside the channel structures 140 in the Y-direction. The tip regions ET may not overlap the channel structures 140 in the X-direction. That is, the tip regions ET may not be disposed on a straight line with the channel structures 140 in the X-direction. The tip regions ET may be disposed to overlap the gate structures 160 in the X-direction.

The first and second source/drain regions 150A and 150B may have substantially flat end portions in the X-direction in plan view. However, as illustrated in FIG. 3, at a level of an upper surface of the fourth channel layer 144, the first and second source/drain regions 150A and 150B may have bent portions by regions extending below the gate spacers 164 in a region in contact with the gate structures 160. Accordingly, at the level of the upper surface of the fourth channel layer 144, the first and second source/drain regions 150A and 150B may cover end portions of the gate spacer layers 164 in the Y-direction. A width of the extended regions in the X-direction may be changed according to a thickness of the gate spacer layers 164.

The channel structures 140 may have a first length L1 in the Y-direction, and the first source/drain regions 150A have second lengths L2a and L2b longer than the first length L1 in the Y-direction. For example, the first length L1 may be in a range of about 20 nm to about 50 nm. The first source/drain regions 150A may have a second center length L2a, which is a maximum length, in a region corresponding to the center in the X-direction and may have a second edge length L2b less than the second central length L2a in a region adjacent to the gate structures 160. The second edge length L2b, which is a length of the first source/drain regions 150A in contact with the gate structures 160 and extending in the Y-direction, may be greater than a fourth length L4 which is a protruding length of the tip region ET. For example, the second edge length L2b may be greater than twice the fourth length L4, but is not limited thereto. For example, the fourth length L4 may range from about 7 nm to about 20 nm. Also, in the first source/drain regions 150A, the second edge length L2b and the second center length L2a, which are the lengths in the Y-direction, may be greater than the third length L3 in the X-direction. However, in some embodiments, the second center length L2a may be greater than the third length L3, and the second edge length L2b may be equal to or smaller than the third length L3.

In the second source/drain regions 150B, a sixth length L6 in the Y-direction may be greater than a fifth length L5 in the X-direction. The sixth length L6 may be the same as or different from the second center length L2a and may have, for example, a range between the second edge length L2b and the second center length L2a. Unlike the first source/drain regions 150A, the second source/drain regions 150B may not have a maximum length in the Y-direction at one point, but may have a maximum length at a plurality of points.

The gate structures 160 may intersect the first and second active regions 105A and 105B and the channel structures 140 on the first and second active regions 105A and 105B and the channel structures 140 to extend in the second direction, for example, the Y-direction. The gate structures 160 may be disposed to be spaced apart from each other in the X-direction. A functional channel region of the transistors may be formed in the first and second active regions 105A and 105B and/or the channel structures 140 intersecting the gate electrodes 165 of the gate structures 160. When the first and second regions R1 and R2 are disposed to be adjacent to each other in the Y-direction, the gate structures 160 may continuously extend from the first and second regions R1 and R2 or may be disposed to be separated by a separate dam structure or a separation structure between the first region R1 and the second region R2.

Each of the gate structures 160 may include a gate electrode 165, gate dielectric layers 162 between the gate electrode 165 and the first to fourth channel layers 141, 142, 143, and 144, and gate spacer layers 164 on the side surfaces of the gate electrode 165. In example embodiments, the gate structure 160 may further include a gate capping layer on an upper surface of the gate electrode 165. Alternatively, a portion of the interlayer insulating layer 190 on the gate structure 160 may be referred to as a gate capping layer.

The gate dielectric layers 162 may be disposed between the gate electrodes 165 and the first and second active regions 105A and 105B and between the channel structure 140 and the gate electrodes 165 (see, e.g., FIG. 2B), and may be disposed to cover at least portions of the surfaces of the gate electrodes 165. For example, the gate dielectric layers 162 may be disposed to surround all surfaces except for the uppermost surfaces of the gate electrodes 165. The gate dielectric layers 162 may extend between the gate electrodes 165 and the spacer layers 164, but are not limited thereto. The gate dielectric layers 162 may include oxide, nitride, or a high-k material. The high-k material may refer to a dielectric material having a dielectric constant higher than that of a silicon oxide layer ($SiO_2$). The high-k material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In some embodiments, each of the gate dielectric layers 162 may be formed of a multilayer film.

The gate electrodes 165 fill spaces between the first to fourth channel layers 141, 142, 143, and 144 on top of the first and second active regions 105A and 105B and extend onto the channel structure 140. The gate electrodes 165 may be spaced apart from the first to fourth channel layers 141, 142, 143, and 144 by the gate dielectric layers 162. The gate electrode 165 may include a conductive material, for example, a metal nitride such as titanium nitride (TiN), tantalum nitride (TaN), or tungsten nitride (WN), and/or metal material such as aluminum (Al), tungsten (W), or molybdenum (Mo), or a semiconductor material such as doped polysilicon. In some embodiments, the gate electrode 165 may be formed of two or more multilayer structures. In some embodiments, the gate electrodes 165 may include different materials in the first region R1 and the second region R2.

The gate spacer layers 164 may be disposed on both side surfaces of the gate electrodes 165 on the channel structure 140. The gate spacer layers 164 may insulate the source/drain regions 150 from the gate electrodes 165. The gate spacer layers 164 may have a multilayer structure according to embodiments. The gate spacer layers 164 may be formed of oxide, nitride, and oxynitride, in particular, a low-κ material.

The inner spacer layers 130 may be disposed in parallel with the gate electrode 165 between adjacent ones of the first to fourth channel layers 141, 142, 143, and 144 in the z-direction. The gate electrode 165 may be stably spaced apart from the first and second source/drain regions 150A and 150B by the inner spacer layers 130 to be electrically separated from each other. Side surfaces of the inner spacer layers 130 facing the gate electrodes 165 may be convexly rounded inwardly toward the gate electrodes 165, but the disclosure is not limited thereto. The inner spacer layers 130 may be formed of oxide, nitride, or oxynitride, and in particular, may be formed of a low-κ material. However, in some embodiments, the inner spacer layers 130 may be omitted.

The capping layer 170 may be disposed to cover at least a portion of the surface of the first source/drain regions 150A, the upper surface of the device isolation layer 110, and the surface of the gate spacer layers 164, in the first region R1. The capping layer 170 may be disposed to cover at least portions of the surfaces of the gate spacer layers 164 and may not extend to the surfaces of the second source/drain regions 150B, in the second region R2 when viewed in the X-direction (see, e.g., FIG. 2C). The capping layer 170 may be a layer for preventing the first source/drain regions 150A from being exposed during a process of forming the second source/drain regions 150B. The capping layer 170 may include an insulating material and may include, for example, at least one of SiO, SiN, SiCN, SiOC, SiON, and SiOCN. As illustrated in FIGS. 1 and 3, the capping layer 170 may cover the tip regions ET of the first source/drain regions 150A in plan view, and may be disposed to extend outwardly of the first source/drain regions 150A in the Y-direction.

In the second region R2, the capping layer 170 may be disposed to extend in the Y-direction along the gate spacer layers 164 and may be in contact with a portion of side surfaces of the second source/drain regions 150B in the X-direction (see, e.g., FIG. 3). However, in the second region R2, surfaces of the second source/drain regions 150B may be covered with the interlayer insulating layer 190. In some embodiments, the surface of the second source/drain regions 150B may be covered with an insulating layer different from the capping layer 170 and the interlayer insulating layer 190.

The contact plugs 180 may pass through the interlayer insulating layer 190 to be connected to the first and second source/drain regions 150A and 150B, and apply an electrical signal to the first and second source/drain regions 150A and 150B. The contact plugs 180 may have inclined side surfaces in which a lower width is narrower than an upper width according to an aspect ratio, but are not limited thereto. The contact plugs 180 may extend from the top, for example, below the lower surface of the fourth channel layers 144 at the top of each of the channel structures 140, but are not limited thereto. In some example embodiments, the contact plugs 180 may be disposed to be in contact with the upper surfaces of the first and second source/drain regions 150A and 150B, without recessing the first and second source/drain regions 150A and 150B. The lower surfaces of the contact plugs 180 may have a curve according to the shape of the upper ends of the first and second source/drain regions 150A and 150B, but the shape of the lower surfaces is not limited thereto.

The contact plugs 180 may include a metal silicide layer disposed at a lower end including a lower surface, and may further include a barrier layer disposed on an upper surface and sidewalls of the metal silicide layer. The barrier layer may include, for example, a metal nitride such as a titanium nitride layer (TiN), a tantalum nitride layer (TaN), or a tungsten nitride layer (WN). The contact plugs 180 may include a metal material such as aluminum (Al), tungsten (W), or molybdenum (Mo). In example embodiments, the number and arrangement of conductive layers constituting the contact plugs 180 may be variously changed. Also, a wiring structure connected to the contact plugs 180 and the gate electrode 165 may be further disposed on the contact plugs 180.

The interlayer insulating layer 190 may be disposed to cover the capping layer 170, the second source/drain regions 150B, the gate structures 160, and the device isolation layer 110. The interlayer insulating layer 190 may include at least one of an oxide, a nitride, and an oxynitride, and may include, for example, a low-κ material. In some embodiments, the interlayer insulating layer 190 may include a plurality of insulating layers.

Figure 4:
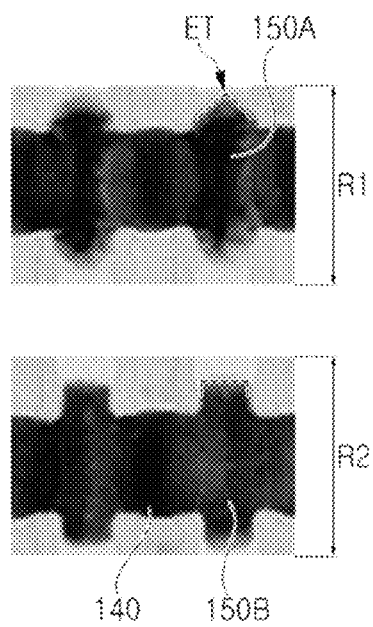
FIG. 4 is an image illustrating a semiconductor device according to example embodiments.

FIG. 4 is an image illustrating a semiconductor device according to example embodiments.

Referring to FIG. 4, a transmission electron microscope (TEM) image of the channel structures 140, the first and second source/drain regions 150A and 150B, and the gate structures 160 at the level of the uppermost surface of the channel structures 140 is illustrated.

As illustrated in the image of FIG. 4, the first source/drain regions 150A of the first region R1 may have a different shape in plan view (e.g., a top view) from the shape of the second source/drain regions 150B of the second region R2. The first source/drain regions 150A may have triangular tip regions ET, and the second source/drain regions 150B may have linear or near-linear end portions without a protruding region.

Figure 5A:
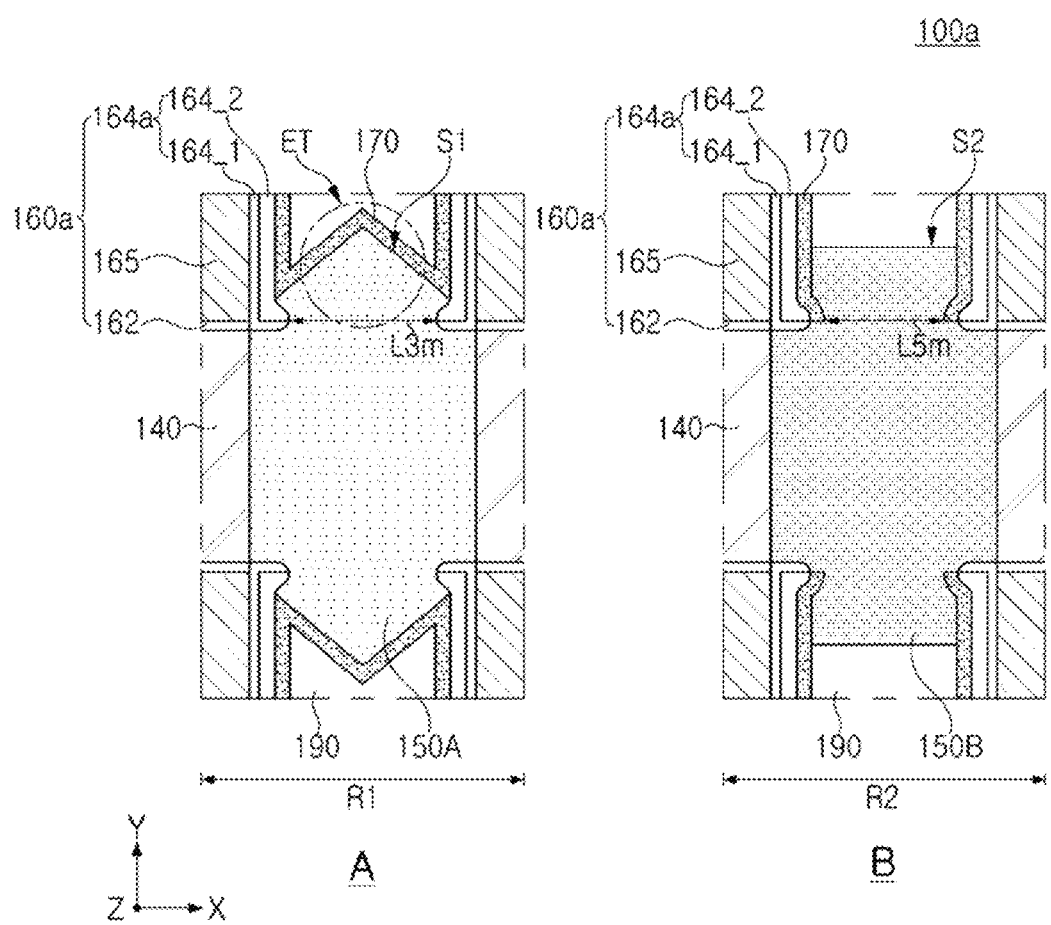
FIGS. 5A and 5B are plan views illustrating semiconductor devices according to example embodiments.
Figure 5B:
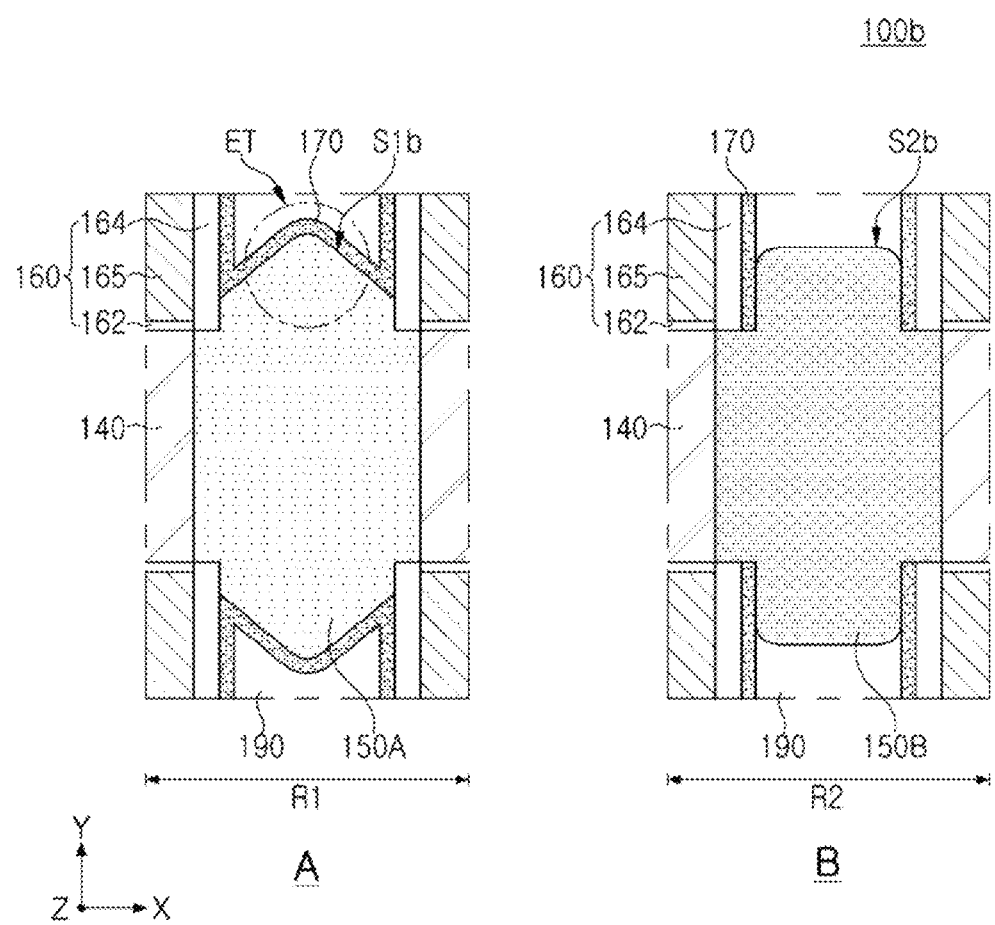

FIGS. 5A and 5B are plan views illustrating semiconductor devices according to example embodiments. FIGS. 5A and 5B illustrate regions corresponding to FIG. 3.

Referring to FIG. 5A, in the semiconductor device 100a, the gate spacer layers 164a of the gate structure 160a may include first and second spacer layers 164_1 and 164_2. The first spacer layer 164_1 may be disposed to contact the gate electrode 165, and the second spacer layer 164_2 may be disposed to cover an outer surface of the first spacer layer 164_1. The first and second spacer layers 164_1 and 164_2 may include different materials. For example, the first spacer layer 164_1 may include silicon nitride, and the second spacer layer 164_2 may include silicon oxide.

In the present example embodiment, the gate spacer layers 164a may have a region protruding in the X-direction toward the first and second source/drain regions 150A and 150B in a region adjacent to the end portion of the channel structure 140 in the Y-direction. In the second region R2, the capping layer 170 may have a region protruding toward the second source/drain region 150B along the second spacer layer 164_2. This may be a shape such as an undulation formed in a boundary between the channel structures 140 and the device isolation layer 110 in the Y-direction when sacrificial gate structures 200 (refer to FIGS. 9A and 9B) replaced with the gate structure 160 are formed. Accordingly, the first spacer layer 164_1 may partially cover at least an end portion of the second spacer layer 164_2 in the Y-direction. In addition, the first and second source/drain regions 150A and 150B may have minimum lengths L3$m$ and L5$m$ in the X-direction on an outer side surface of the channel structure 140 in the Y-direction or in a region adjacent to an end portion of the gate spacer layers 164a in the Y-direction.

Referring to FIG. 5B, in a semiconductor device 100b, the shapes of the end portions S1$b$ and S2$b$ of the first and second source/drain regions 150A and 150B in the Y-direction may be different from that of the embodiment of FIG. 3. The end portions S1$b$ of the first source/drain region 150A may have a rounded triangular or parabolic shape. The end portions S2$b$ of the second source/drain region 150B may have a partially convex shape outwardly in the Y-direction. However, even in this case, the second source/drain region 150B may not have a protruding region in the Y-direction having a maximum length or any one region protruding maximally. As such, specific shapes of the end portions S1$b$ and S2$b$ in the first and second source/drain regions 150A and 150B may be partially changed in the embodiments.

Figure 6:
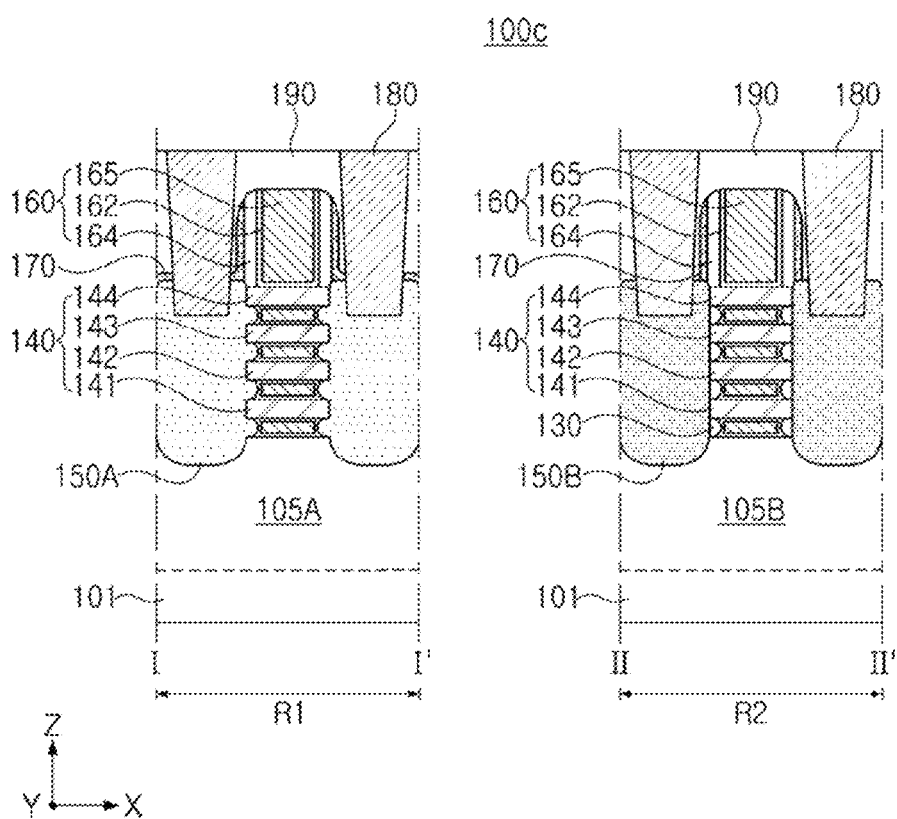
FIG. 6 is a cross-sectional view illustrating a semiconductor device according to example embodiments.

FIG. 6 is a cross-sectional view illustrating a semiconductor device according to example embodiments. FIG. 6 illustrates a region corresponding to FIG. 2A.

Referring to FIG. 6, in a semiconductor device 100c, the inner spacer layer 130 may not be disposed in at least one region, for example, the first region R1. In the first region R1, the first source/drain regions 150A may have a shape expanding to a region in which the inner spacer layers 130 are omitted. Accordingly, the first source/drain regions 150A may include regions extending between the first to fourth channel layers 141, 142, 143 and 144 and below the first channel layer 141. In an embodiment, the first source/drain regions 150A do not expand to the region in which the inner spacer layers 130 are omitted, and the gate electrode 165 and the gate dielectric layers 162 may instead expand in the X-direction.

According to this structure, the inner spacer layer 130 may be omitted, so that the first source/drain regions 150A may be formed to have improved crystallinity. For example, when the first source/drain regions 150A include SiGe, the inner spacer layer 130 may be selectively omitted only in the first region R1 to improve SiGe crystallinity. However, according to embodiments, the region in the inner spacer layer 130 is omitted in the semiconductor device 100c may be variously changed.

Figure 7A:
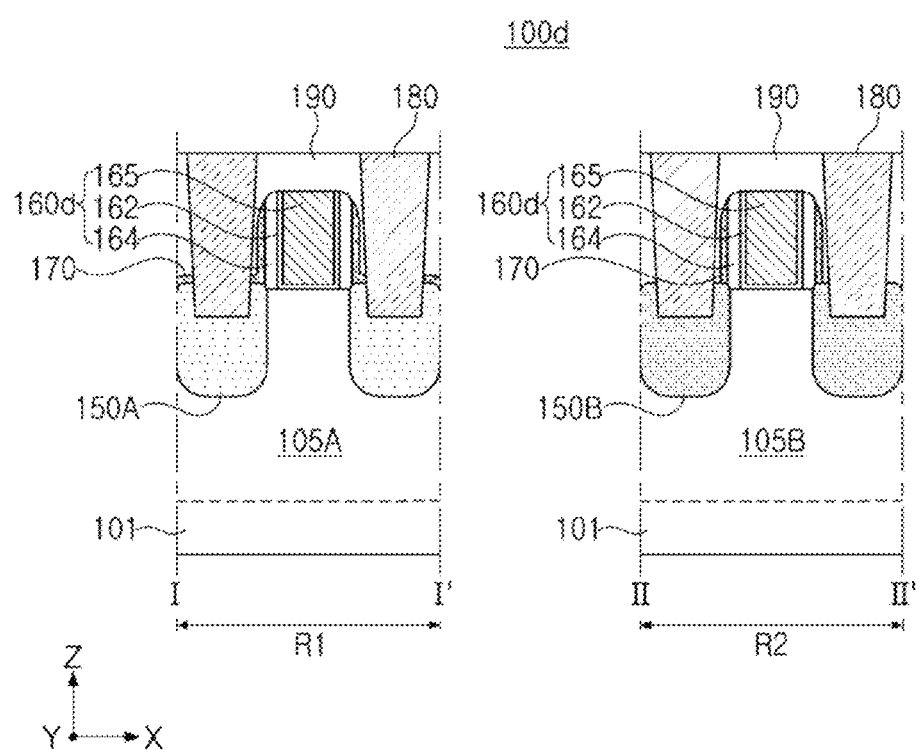
FIGS. 7A and 7B are cross-sectional views illustrating semiconductor devices according to example embodiments.
Figure 7B:
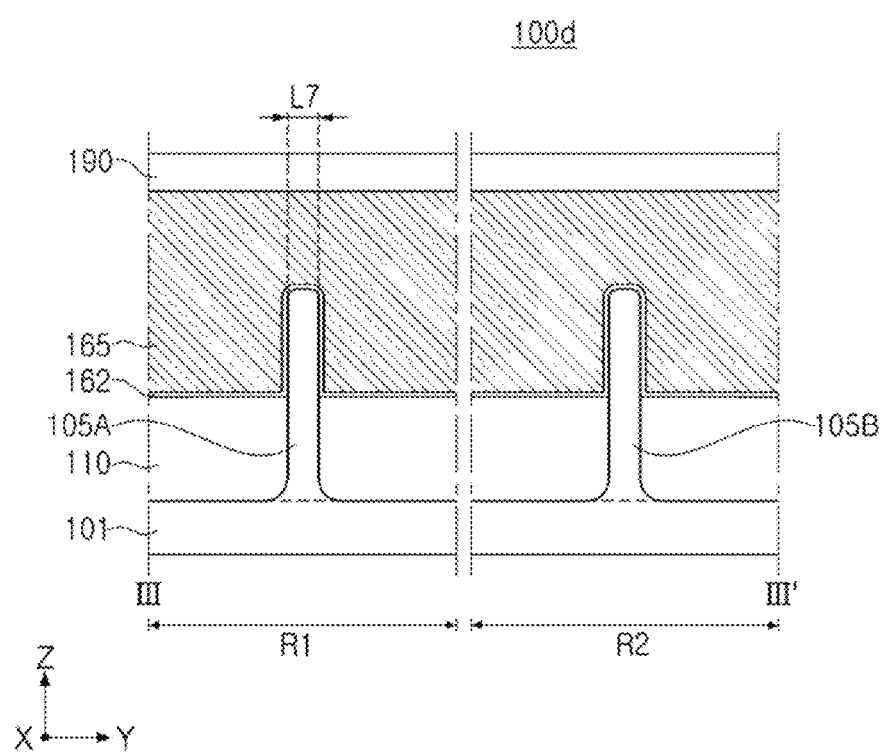

FIGS. 7A and 7B are cross-sectional views illustrating a semiconductor device according to example embodiments. FIGS. 7A and 7B illustrate cross-sections corresponding to FIGS. 2A and 2B, respectively.

Referring to FIGS. 7A and 7B, unlike the example embodiment of FIGS. 1 to 3, the semiconductor device 100d may not include the channel structures 140, and accordingly, an arrangement of the gate structure 160d may be different from the above embodiment. The semiconductor device 100d may include FinFETs not including separate channel layers 141, 142, 143, and 144.

In the semiconductor device 100d, a channel region of the transistors may be defined in the first and second active regions 105A and 105B having a fin structure. A width L7 of the first and second active regions 105A and 105B in the Y-direction may be, for example, in a range of about 7 nm to about 50 nm. In embodiments, when the width L7 is relatively large, a difference in the shape of the end portions of the first and second source/drain regions 150A and 150B in plan view may be more clearly recognized.

Separate channel layers may not be interposed in the gate electrodes 165, and the gate structure 160d may include one gate dielectric layer 162. However, the description for the gate electrodes 165 and the description for the first and second source/drain regions 150A and 150B in the embodiment of FIGS. 1 to 3 may be equally applied to the description for the present embodiment. Such a semiconductor device 100*d* may be additionally disposed in one region of the semiconductor device of other embodiments.

FIGS. 8A to 15B are views illustrating a process sequence of a method of manufacturing a semiconductor device according to example embodiments. FIGS. 8A to 15B illustrate an embodiment of a method for manufacturing the semiconductor device of FIGS. 1 to 3, and variously illustrate cross-sections taken along lines I-I', II-II', and III-III' of FIG. 1 together.

Figure 8A:
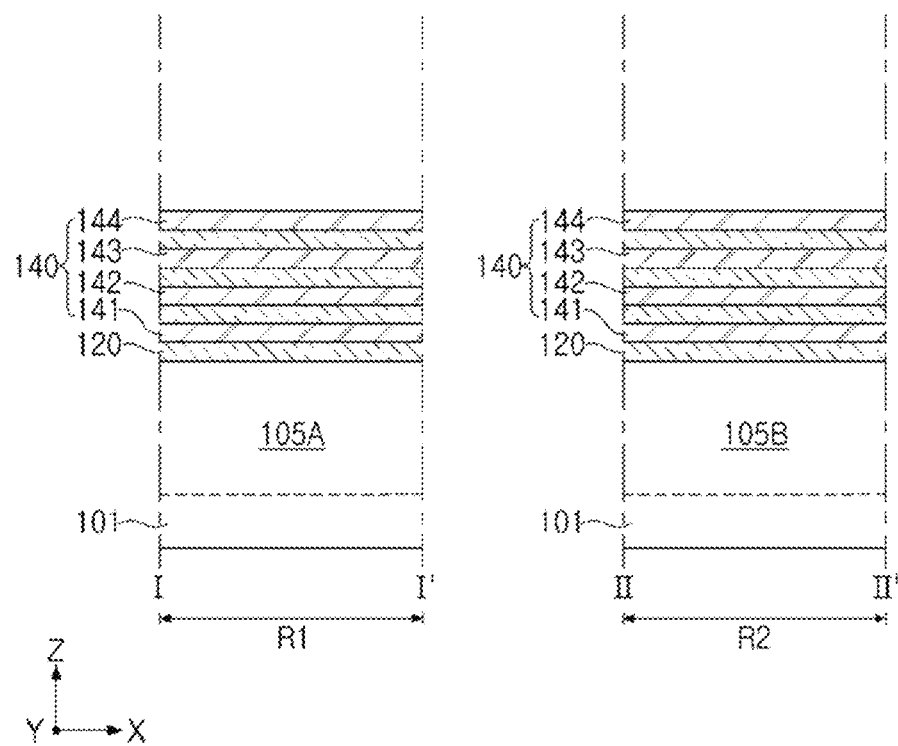
FIGS. 8A to 15B are views illustrating a method of manufacturing a semiconductor device according to example embodiments.
Figure 8B:
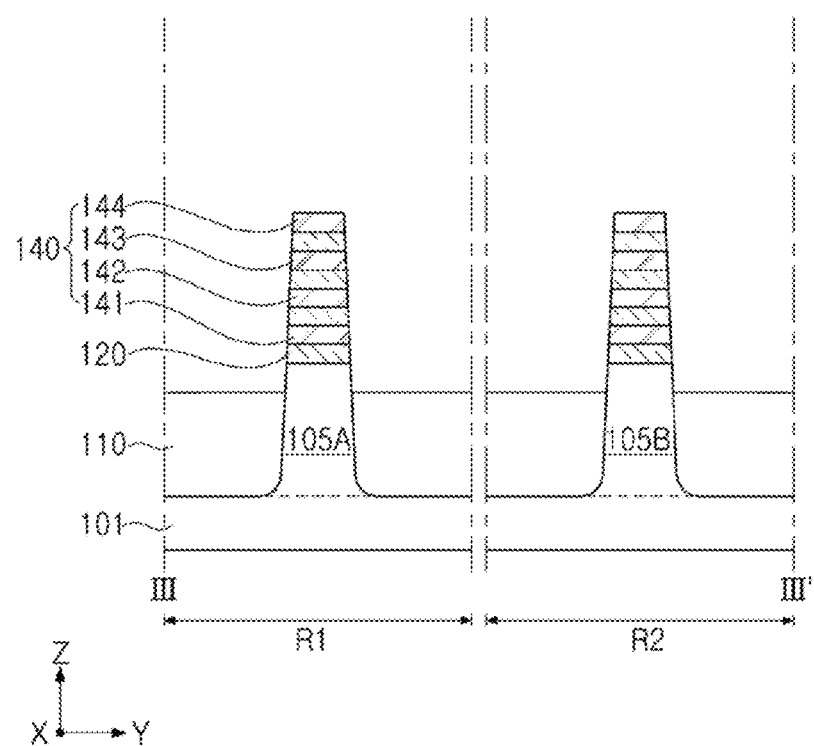

Referring to FIGS. 8A and 8B, sacrificial layers 120 and first to fourth channel layers 141, 142, 143 and 144 are alternately stacked on a substrate 101, and active structures including first and second active regions 105A and 105B may be formed.

The sacrificial layers 120 may be replaced by the gate dielectric layers 162 and the gate electrodes 165 below the fourth channel layer 144 as illustrated in FIGS. 2A and 2B through a subsequent process. The sacrificial layers 120 may be formed of a material having etch selectivity with respect to the first to fourth channel layers 141, 142, 143, and 144, respectively. The first to fourth channel layers 141, 142, 143, and 144 may include a material different from that of the sacrificial layers 120. The sacrificial layers 120 and the first to fourth channel layers 141, 142, 143, and 144 may include, for example, at least one of silicon (Si), silicon germanium (SiGe), and germanium (Ge) but may include different materials, and may or may not include impurities. For example, the sacrificial layers 120 may include silicon germanium (SiGe), and the first to fourth channel layers 141, 142, 143, and 144 may include silicon (Si).

The sacrificial layers 120 and the first to fourth channel layers 141, 142, 143, and 144 may be formed by performing an epitaxial growth process from the substrate 101. Each of the sacrificial layers 120 and the first to fourth channel layers 141, 142, 143, and 144 may have a thickness in a range of about 1 Å to about 100 nm. The number of layers of the channel layers 141, 142, 143, and 144 alternately stacked with the sacrificial layers 120 may be variously changed in embodiments.

Next, the active structures may be formed by patterning the sacrificial layers 120, the first to fourth channel layers 141, 142, 143, and 144, and the upper region of the substrate 101. The active structures may include sacrificial layers 120 and first to fourth channel layers 141, 142, 143, and 144 alternately stacked with each other, and may further include the first and second active regions 105A and 105B formed to protrude from the substrate 101 as a portion of the substrate 101 is removed. The active structures may be formed in a line shape extending in one direction, for example, the X-direction, and may be formed to be spaced apart from each other in the Y-direction. Depending on the aspect ratio, side surfaces of the active structures may be inclined to have a width increasing downwardly in the Z-direction.

The region, from which a portion of the substrate 101 is removed, may be filled with an insulating material, the insulating material may then be partially removed such that the first and second active regions 105A and 105B protrude, thereby forming the device isolation layer 110. An upper surface of the device isolation layer 110 may be formed to be lower than an upper surface of the first and second active regions 105A and 105B.

Figure 9A:
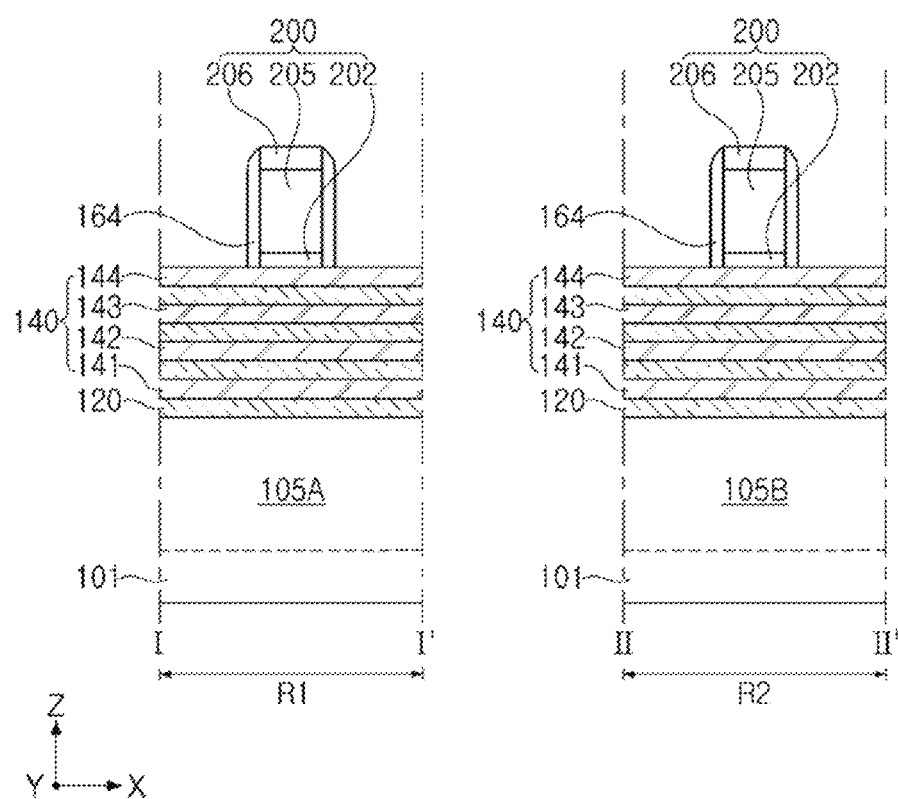
Figure 9B:
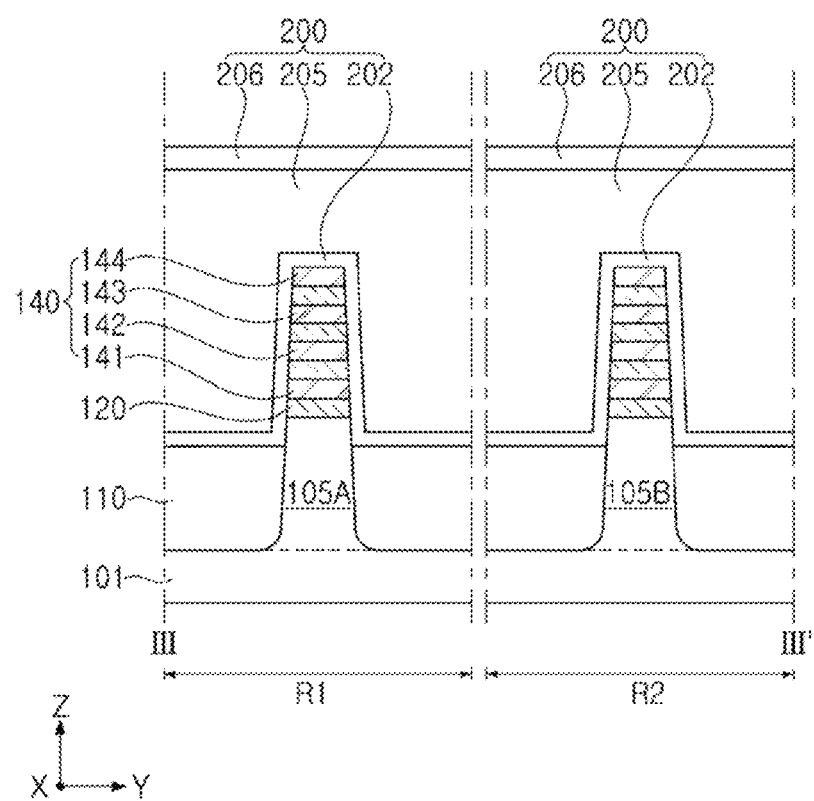

Referring to FIGS. 9A and 9B, a sacrificial gate structure 200 and gate spacer layers 164 may be formed on the active structures.

The sacrificial gate structures 200 may be sacrificial structures formed in a region in which the gate dielectric layer 162 and the gate electrode 165 are disposed on the channel structures 140 as illustrated in FIGS. 2A and 2B through a subsequent process. The sacrificial gate structures 200 may have a line shape intersecting the active structures and extending in one direction. The sacrificial gate structures 200 may extend, for example, in the Y-direction and may be disposed to be spaced apart from each other in the X-direction.

The sacrificial gate structure 200 may include first and second sacrificial gate layers 202 and 205 and a mask pattern layer 206 that are sequentially stacked. The first and second sacrificial gate layers 202 and 205 may be patterned using a mask pattern layer 206. The first and second sacrificial gate layers 202 and 205 may be an insulating layer and a conductive layer, respectively, but are not limited thereto, and the first and second sacrificial gate layers 202 and 205 may be formed as a single layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 164 may be formed on both sidewalls of the sacrificial gate structures 200. The gate spacer layers 164 may be formed of a low-κ material, and may include, for example, at least one of SiO, SiN, SiCN, SiOC, SiON, and SiOCN.

Figure 10A:
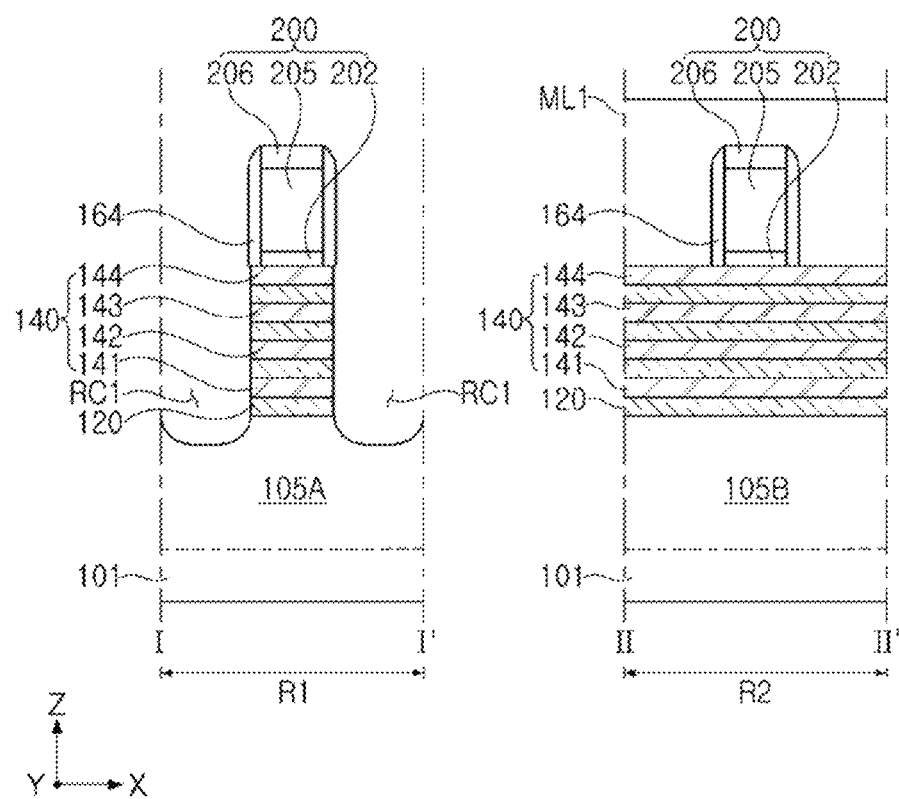
Figure 10B:
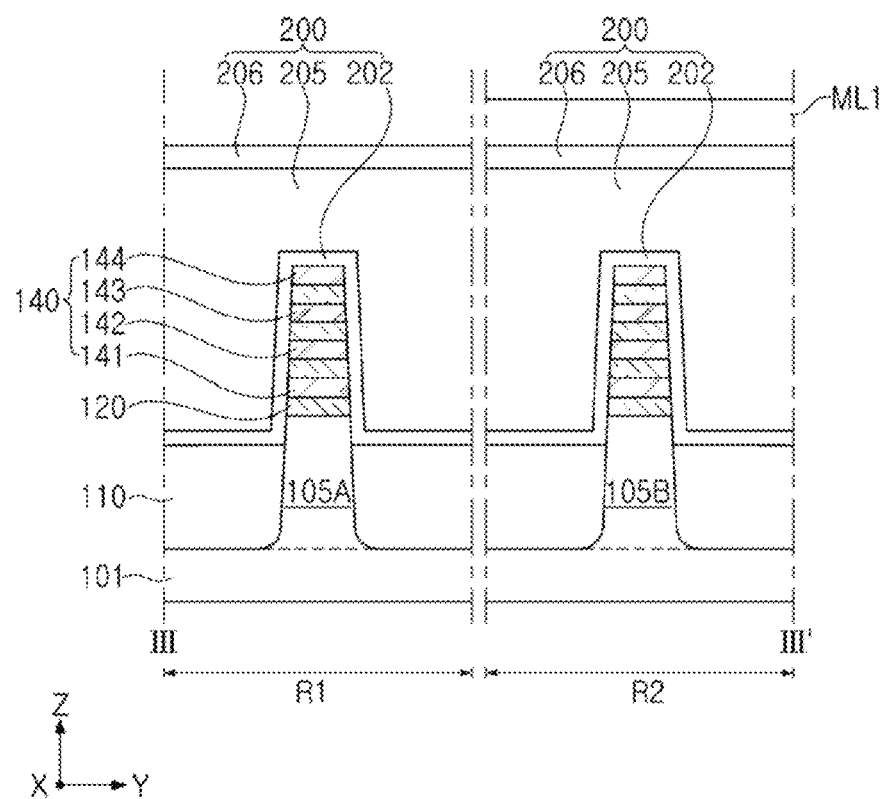

Referring to FIGS. 10A and 10B, a first mask layer ML1 covering the second region R2 may be formed, and the sacrificial layers 120 and the first to fourth channel layers 141, 142, 143, and 144 exposed by the sacrificial gate structure 200 in the first region R1 may be partially removed to form first recess regions RC1.

First, the first mask layer ML1 may be formed to cover the second region R2 and expose the first region R1. The first mask layer ML1 may include, for example, a photoresist layer.

Next, using the sacrificial gate structures 200 and the gate spacer layers 164 as masks, the sacrificial layers 120 and the first to fourth channel layers 141 142, 143, and 144 exposed in the first region R1 may be removed to form the first recess regions RC1. Accordingly, in the first region R1, the first to fourth channel layers 141, 142, 143, and 144 may form channel structures 140 having a limited length in the X-direction.

Figure 11A:
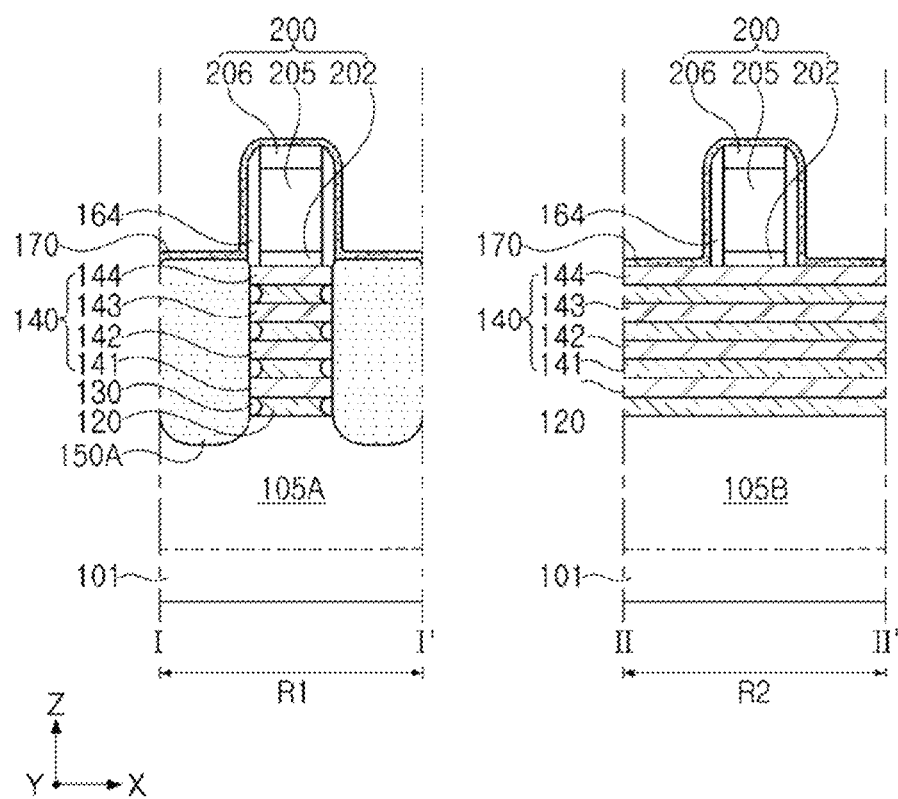
Figure 11B:
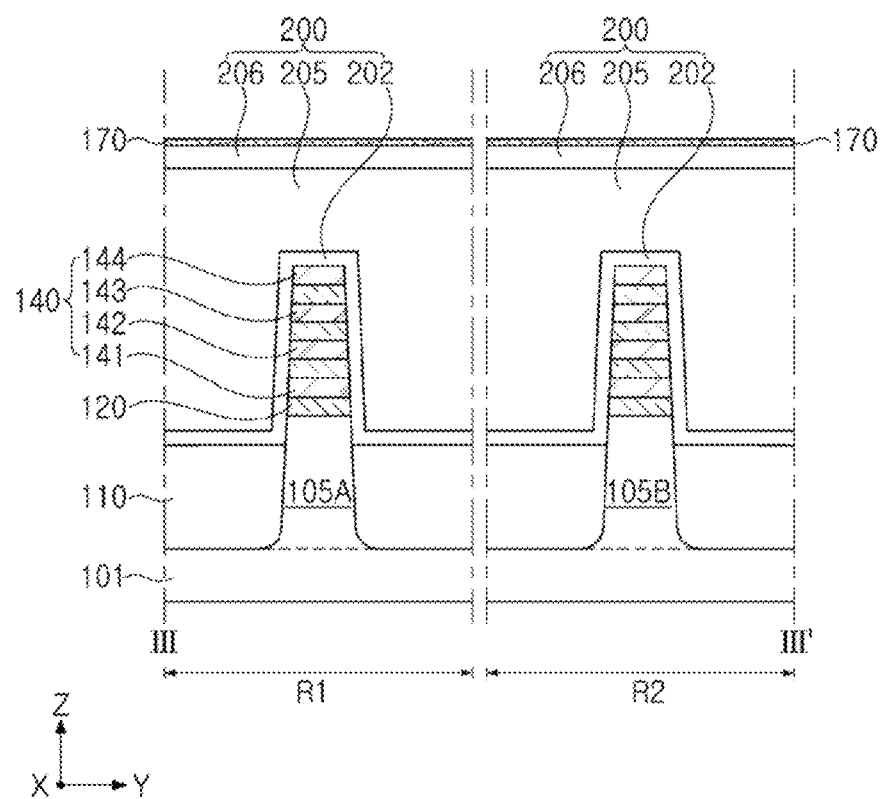

Referring to FIGS. 11A and 11B, after the first mask layer ML1 is removed, inner spacer layers 130 are formed in the first region R1, the first source/drain regions 150A may be formed in the first recess regions RC1, and a capping layer 170 may be formed.

First, the first mask layer ML1 may be removed from the second region R2. The first mask layer ML1 may be removed by a cleaning process such as an ashing process. However, in some embodiments, the first mask layer ML1 may be removed after forming the first source/drain regions 150A.

Next, some of the sacrificial layers 120 may be removed, and inner spacer layers 130 may be formed. The sacrificial layers 120 may be selectively etched with respect to the channel structure 140 by, for example, a wet etching process, and removed to a predetermined depth from the side surface in the X-direction. The sacrificial layers 120 may have inwardly concave side surfaces by side etching as described above. However, a specific shape of the side surfaces of the sacrificial layers 120 is not limited to that illustrated in FIG. 11A. The inner spacer layers 130 may be formed by filling the region from which the sacrificial layers 120 are removed with an insulating material and then removing the insulating material deposited on the outside of the channel structures 140. The inner spacer layers 130 may be formed of the same material as that of the gate spacer layers 164, but are not limited thereto. For example, the inner spacer layers 130 may include at least one of SiN, SiCN, SiOCN, SiBCN, and SiBN.

Next, the first source/drain regions 150A may be formed by growing from side surfaces of the first active regions 105A and the channel structures 140, for example, by a selective epitaxial process. The first source/drain regions 150A may be grown in a saturation growth mode. For example, the first source/drain regions 150A may be grown under a relatively low pressure condition, for example, at a pressure of about 20 Torr to about 50 Torr. Accordingly, the first source/drain regions 150A may be mainly grown along an energetically stable crystal plane. Accordingly, as described above with reference to FIG. 3, the first source/drain regions 150A may be formed to have the tip region ET at end portions in the Y-direction in plan view. The first source/drain regions 150A may include impurities by in-situ doping, and may include a plurality of layers having different doping elements and/or doping concentrations.

The capping layer 170 may be formed on exposed surfaces including a surface of the first source/drain regions 150A, an upper surface of the sacrificial gate structures 200, a surface of the gate spacer layers 164, and an upper surface of the device isolation layer 110. The capping layer 170 may be a layer to protect the surface of the first source/drain regions 150A during a subsequent process and to inhibit additional growth of the first source/drain regions 150A.

Figure 12A:
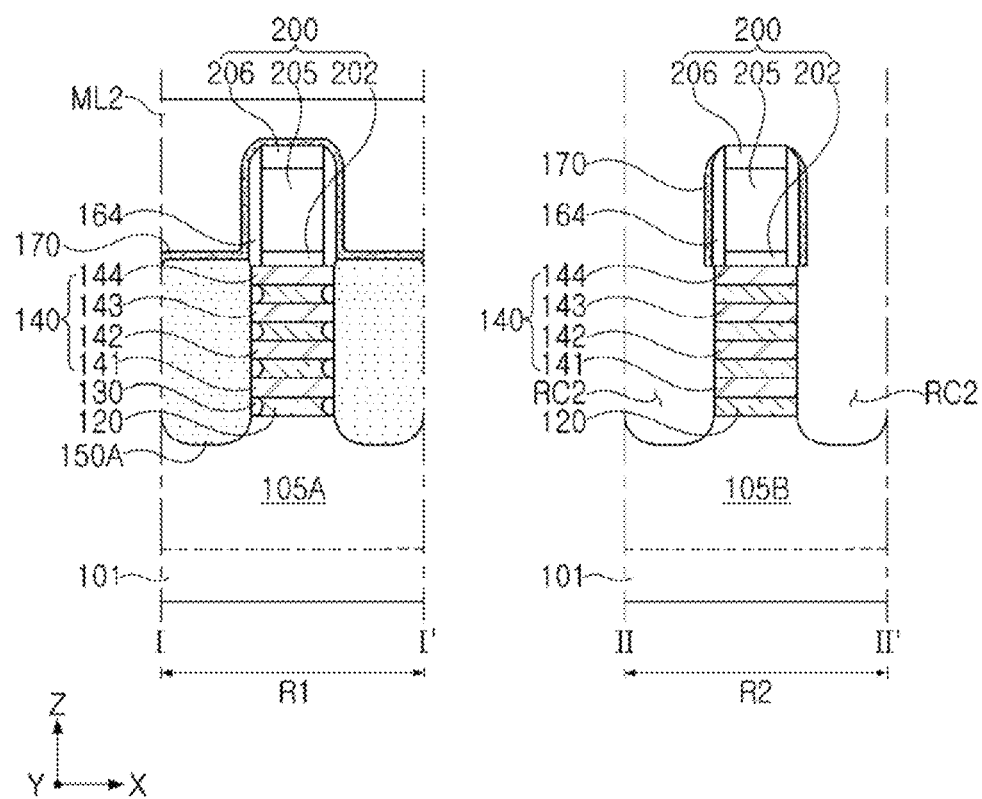
Figure 12B:
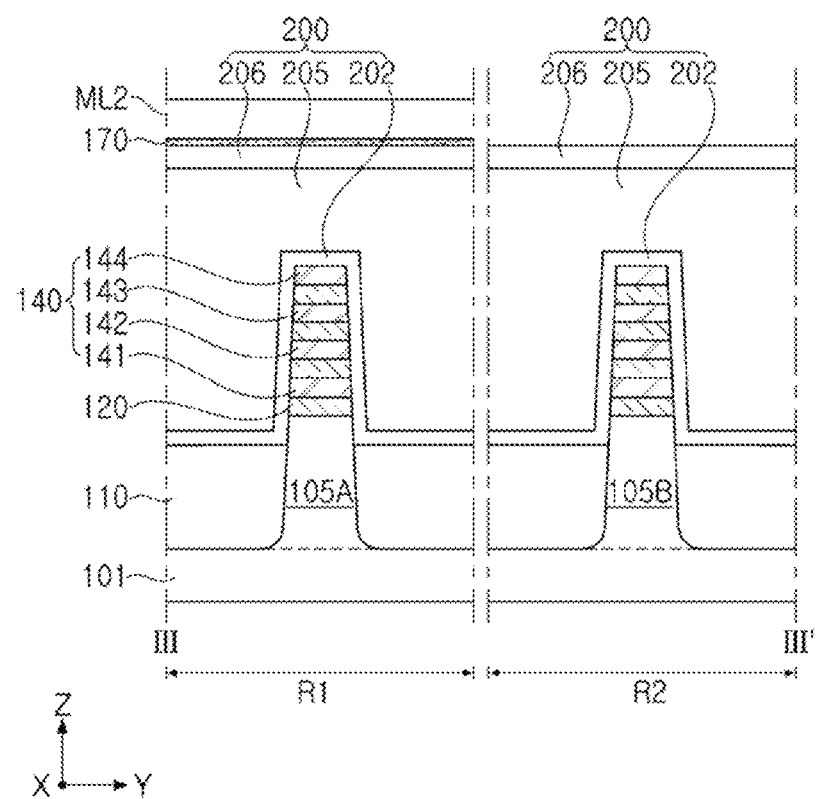

Referring to FIGS. 12A and 12B, the second mask layer ML2 covering the first region R1 may be formed, and the sacrificial layers 120 and the first to fourth channel layers 141, 142, 143, and 144 exposed by the sacrificial gate structure 200 in the second region R2 may be partially removed to form second recess regions RC2.

This process may be performed on the second region R2 similarly to the process described above with reference to FIGS. 10A and 10B. First, the second mask layer ML2 may be formed to cover the first region R1 and expose the second region R2. The second mask layer ML2 may include, for example, a photoresist layer.

Next, the sacrificial layers 120 and the first to fourth channel layers 141 exposed in the second region R2 may be partially removed using the sacrificial gate structures 200 and the gate spacer layers 164 as masks to form second recess regions RC2. Accordingly, in the second region R2, the first to fourth channel layers 141, 142, 143, and 144 may form channel structures 140 having a limited length in the X-direction. When the second recess regions RC2 are formed, the capping layer 170 on the upper surface of the sacrificial gate structures 200 in the second region R2 may be removed together.

Figure 13A:
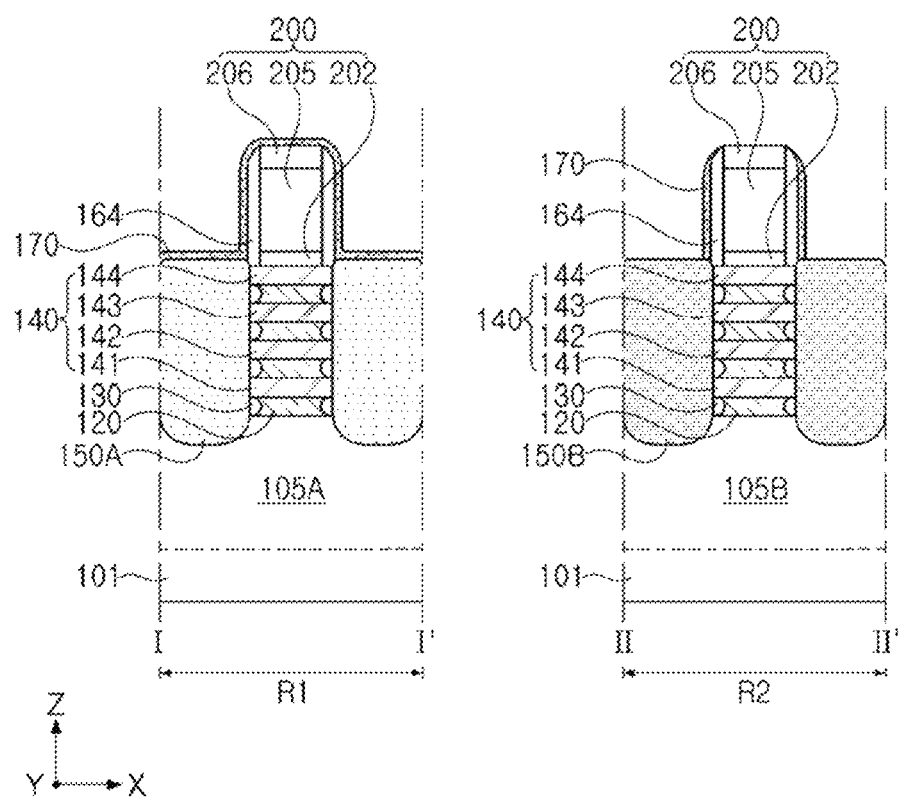
Figure 13B:
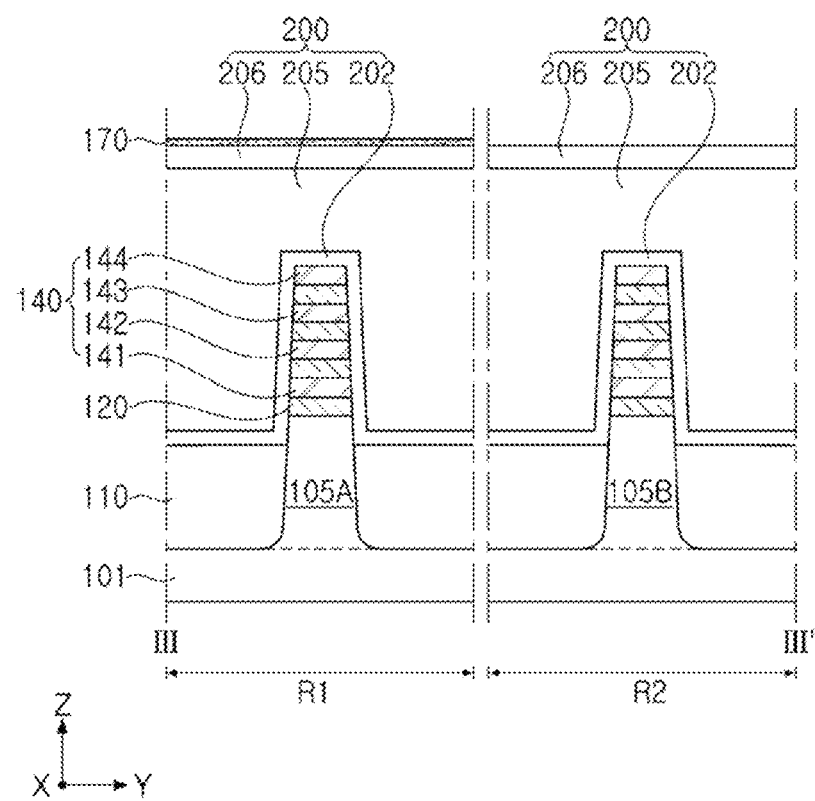

Referring to FIGS. 13A and 13B, after removing the second mask layer ML2, inner spacer layers 130 may be formed in the second region R2, and second source/drain regions 150B may be formed in the second recess regions RC2.

First, the second mask layer ML2 may be removed from the first region R1. Next, as described above with reference to FIGS. 11A and 11B, the inner spacer layers 130 may be formed after partially removing the sacrificial layers 120 also in the second region R2.

Next, the second source/drain regions 150B may be formed by growing from side surfaces of the second active regions 105B and the channel structures 140, for example, by a selective epitaxial process. The second source/drain regions 150B may be formed by a process different from that of the first source/drain regions 150A. The second source/drain regions 150B may be grown in a non-saturation growth mode. For example, the second source/drain regions 150B may be grown under a relatively high pressure condition, for example, at a pressure of about 250 Torr to about 450 Torr. Accordingly, the second source/drain regions 150B may grow relatively quickly, but may not grow along the crystal plane. Accordingly, as described above with reference to FIG. 3, the second source/drain regions 150B may be formed so that end portions thereof in the Y-direction have a flat shape in plan view. The second source/drain regions 150B may include impurities by in-situ doping, and may also include a plurality of layers having different doping elements and/or doping concentrations.

Figure 14A:
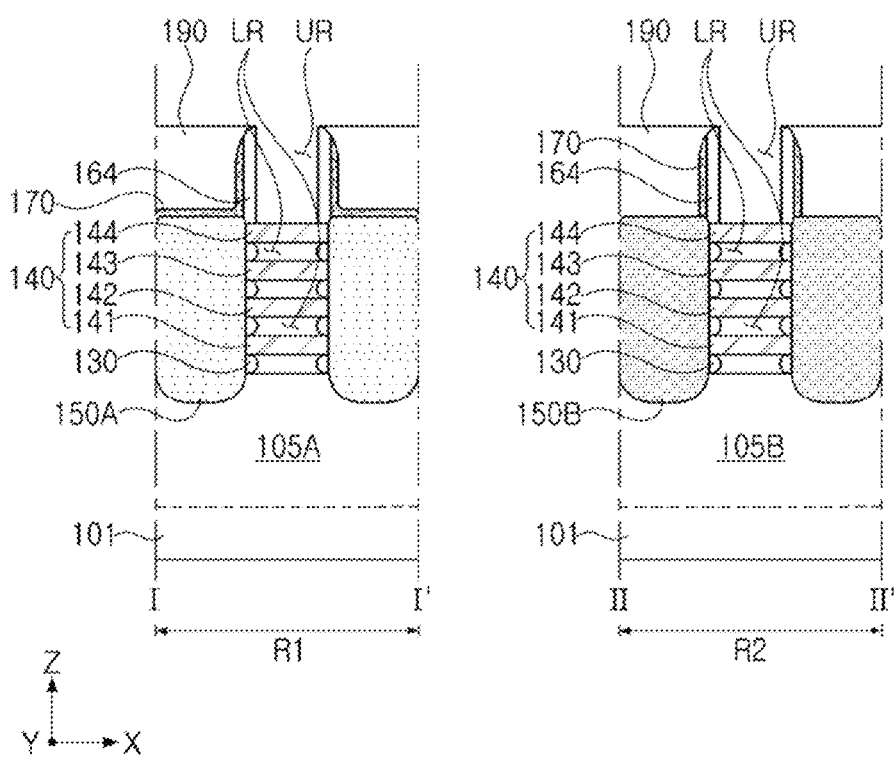
Figure 14B:
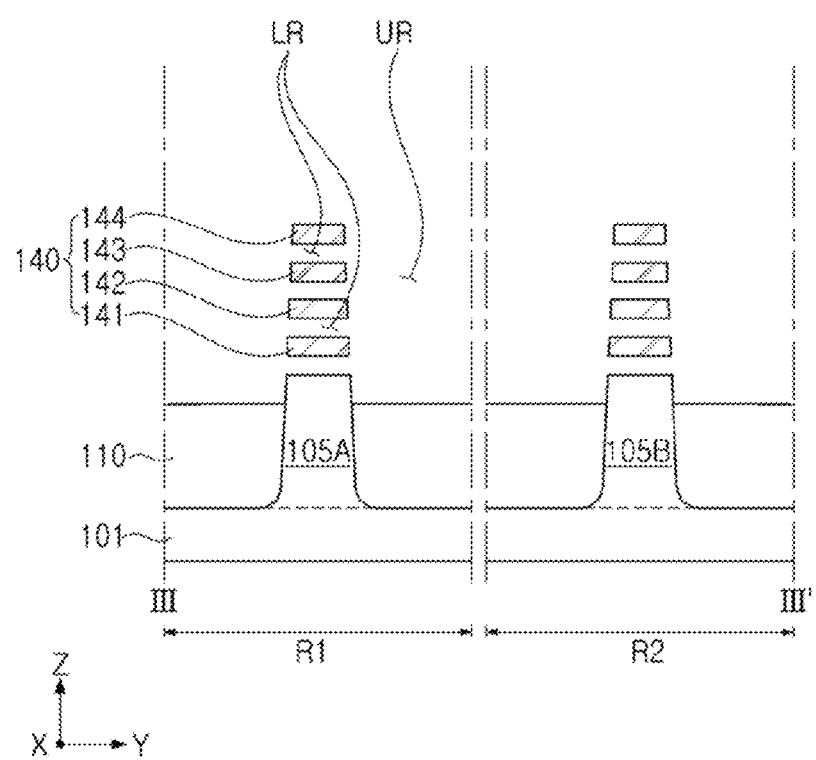

Referring to FIGS. 14A and 14B, the interlayer insulating layer 190 may be formed, and the sacrificial layers 120 and the sacrificial gate structures 200 may be removed.

The interlayer insulating layer 190 may be formed by forming an insulating layer covering the sacrificial gate structures 200, the capping layer 170, and the first and second source/drain regions 150A and 150B, and performing a planarization process to form the mask pattern layer 206.

The sacrificial layers 120 and the sacrificial gate structures 200 may be selectively removed with respect to the gate spacer layers 164, the interlayer insulating layer 190, the channel structures 140, and the inner spacer layers 130. First, the sacrificial gate structures 200 may be removed to form upper gap regions UR, and then the sacrificial layers 120 exposed through the upper gap regions UR may be removed to form the lower gap regions LR. For example, when the sacrificial layers 120 include silicon germanium (SiGe) and the channel structures 140 include silicon (Si), the sacrificial layers 120 may be selectively removed by performing a wet etching process using peracetic acid as an etchant. During the removal process, the first and second source/drain regions 150A and 150B may be protected by the interlayer insulating layer 190 and the inner spacer layers 130.

Figure 15A:
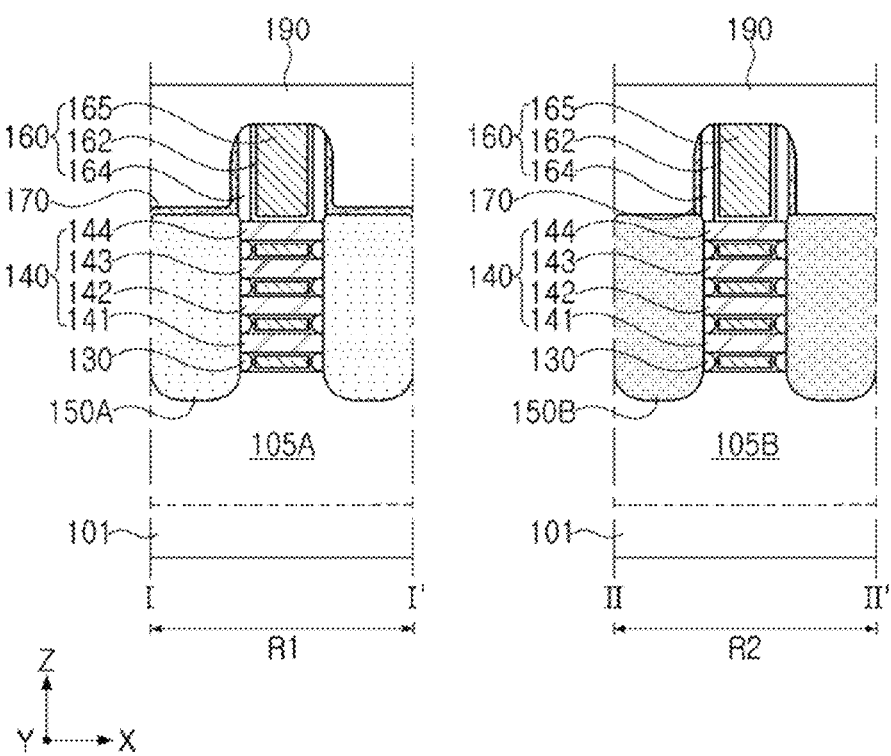
Figure 15B:
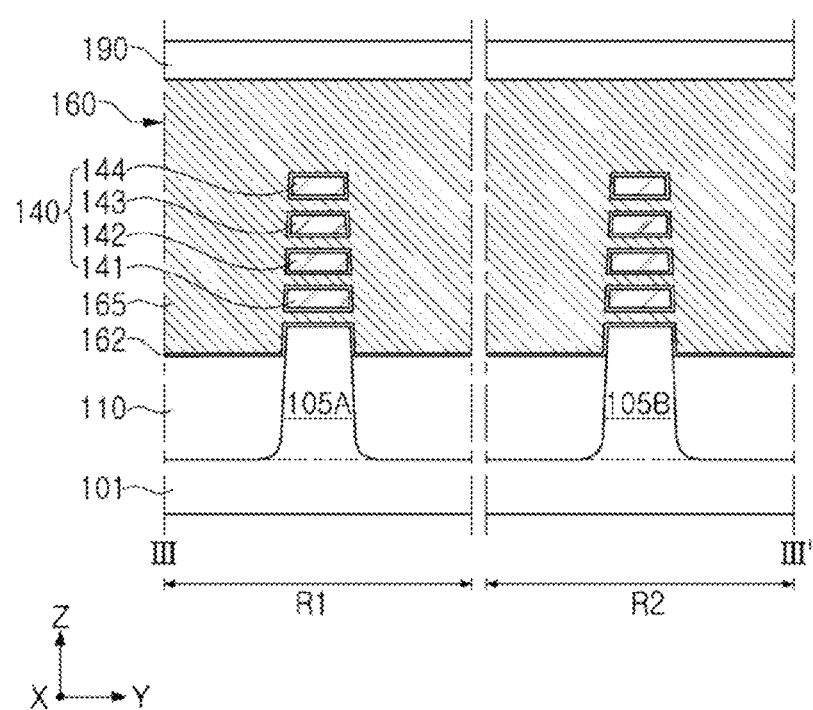

Referring to FIGS. 15A and 15B, gate structures 160 may be formed.

The gate structures 160 may be formed to fill the upper gap regions UR and the lower gap regions LR. The gate dielectric layers 162 may be formed to conformally cover inner surfaces of the upper gap regions UR and the lower gap regions LR. After the gate electrodes 165 are formed to completely fill the upper gap regions UR and the lower gap regions LR, the upper gap regions UR may be removed by a predetermined depth from an upper portion together with the gate dielectric layers 162 and the gate spacer layers 164. Accordingly, the gate structures 160 including the gate dielectric layer 162, the gate electrode 165, and the gate spacer layers 164 may be formed.

Next, an interlayer insulating layer 190 may further be formed on the gate structures 160.

Next, referring to FIGS. 2A and 2B together, contact plugs 180 may be formed.

Contact holes exposing the first and second source/drain regions 150A and 150B may be formed by patterning the interlayer insulating layer 190. Next, the contact plugs 180 may be formed by filling the contact holes with a conductive material. Specifically, after depositing a material constituting a barrier layer in the contact holes, a silicide process may be performed to form a metal-semiconductor compound layer such as a silicide layer at a lower portion. Thereafter, a conductive material may be deposited to fill the contact holes to form the contact plugs 180. Accordingly, the semiconductor device 100 of FIGS. 1 to 3 may be manufactured.

A semiconductor device with improved mass productivity may be provided by optimizing a process for forming the source/drain regions and the shape of the source/drain regions.

While example embodiments have been illustrated and described above, it will be apparent to those skilled in the art that modifications and variations could be made without departing from the scope of the disclosure as defined by the appended claims.

What is claimed is:

1. A semiconductor device comprising:
   a substrate comprising a first region, a second region, and active regions extending in a first direction in the first region and in the second region;
   gate electrodes on the first region and the second region, the gate electrodes intersecting the active regions and extending in a second direction;
   a plurality of channel layers spaced apart from each other in a third direction on the active regions and encompassed by the gate electrodes, the third direction being perpendicular to an upper surface of the substrate; and
   first source/drain regions and second source/drain regions in portions of the active regions that are recessed on opposite sides of the gate electrodes, the first source/drain regions and the second source/drain regions being connected to the plurality of channel layers,
   wherein the first source/drain regions are in the first region, and the second source/drain regions are in the second region,
   wherein an end portion of each of the first source/drain regions in the second direction in a plan view comprises a tip region protruding in the second direction,
   wherein an end portion of each of the second source/drain regions in the second direction in the plan view extends flatly in the first direction, and
   wherein each tip region comprises a triangular region in the plan view that points in the second direction.

2. The semiconductor device of claim 1, wherein each of the first source/drain regions and each of the second source/drain regions have a first length in the first direction and a second length, greater than the first length, in the second direction.

3. The semiconductor device of claim 2, wherein, in the plan view, each of an end portion of each of the first source/drain regions and an end portion of each of the second source/drain regions in the first direction comprises a flat region extending flatly in the second direction, and
   wherein a length of each flat region in the second direction is greater than the first length.

4. The semiconductor device of claim 1, wherein the tip regions are positioned in a center of the first source/drain regions in the first direction.

5. The semiconductor device of claim 1, wherein each of the plurality of channel layers has a third length in the second direction, and
   wherein each of the first source/drain regions has a fourth length, greater than the third length, in the second direction.

6. The semiconductor device of claim 5, wherein the third length is in a range of about 20 nm to about 50 nm.

7. The semiconductor device of claim 1, further comprising:
   a capping layer covering a surface of each of the first source/drain regions,
   wherein, in the plan view, the capping layer covers each of the tip regions and extends to an outer side of each of the first source/drain regions.

8. The semiconductor device of claim 7, further comprising an interlayer insulating layer covering the capping layer and covering the second source/drain regions.

9. The semiconductor device of claim 1, further comprising:
   gate spacer layers on opposite sides of the gate electrodes,
   wherein, in the plan view at a level of an uppermost surface of the plurality of channel layers, the first source/drain regions and the second source/drain regions cover end portions of the gate spacer layers in the second direction.

10. The semiconductor device of claim 9, wherein, in the plan view at the level of the uppermost surface of the plurality of channel layers, the end portions of the gate spacer layers protrude into the first source/drain regions and the second source/drain regions.

11. The semiconductor device of claim 1, wherein the first source/drain regions comprise a first material and the second source/drain regions comprise a second material different from the first material.

12. The semiconductor device of claim 11, wherein the first source/drain regions comprise silicon germanium (SiGe).

13. A semiconductor device comprising:
    a substrate comprising a first active region and a second active region extending in a first direction, spaced apart from each other in a second direction, the first active region comprising impurities of a first conductivity type and the second active region comprising impurities of a second conductivity type different from the first conductivity type;
    at least one gate electrode intersecting the first active region and the second active region and extending in the second direction;
    a plurality of channel layers spaced apart from each other in a third direction on the first active region and the second active region and encompassed by the at least one gate electrode, the third direction being perpendicular to an upper surface of the substrate;
    first source/drain regions on opposite sides of the at least one gate electrode on the first active region, the first source/drain regions being connected to the plurality of channel layers; and
    second source/drain regions disposed on opposite sides of the at least one gate electrode on the second active region, the second source/drain regions being connected to the plurality of channel layers,
    wherein the first source/drain regions and the second source/drain regions have different shapes in a plan view,
    wherein an end portion of each of the first source/drain regions in the second direction in the plan view comprises a tip region protruding in the second direction, and
    wherein each tip region comprises a triangular region in the plan view that points in the second direction.

14. The semiconductor device of claim 13, wherein the end portion of each of the second source/drain regions in the second direction in the plan view is formed without a region protruding in the second direction.

15. The semiconductor device of claim 14, wherein the end portion of each of the second source/drain regions in the second direction in the plan view has a substantially flat shape.

16. The semiconductor device of claim 13, wherein the tip regions overlap the at least one gate electrode in the first direction, and wherein the tip regions are formed without overlapping the plurality of channel layers in the first direction.

17. The semiconductor device of claim 13, wherein each of the first source/drain regions has a maximum length in the second direction in a center of the first source/drain regions in the first direction.

18. A semiconductor device comprising:

a substrate comprising a first region, a second region, and active regions extending in a first direction in the first region and in the second region;

gate structures on the first region and the second region, the gate structures intersecting the active regions and extending in a second direction; and first source/drain regions and second source/drain regions in respective portions of the active regions that are recessed on opposite sides of the gate structures, wherein the first source/drain regions are in the first region and an end portion of each of the first source/drain regions in the second direction comprises a tip region protruding in the second direction in a plan view, wherein the second source/drain regions are in the second region and an end portion of each of the second source/drain regions in the second direction is formed without a region protruding in the second direction in the plan view, wherein a first length of a portion of each of the first source/drain regions in contact with at least one of the gate structures and extending in the second direction is greater than a second length by which each tip region protrudes in the second direction, and wherein each tip region comprises a triangular region in the plan view that points in the second direction.

19. The semiconductor device of claim 18, wherein the first length is equal to or greater than twice the second length.

* * * * *